US009793862B2

(12) United States Patent
Motoi et al.

(10) Patent No.: US 9,793,862 B2
(45) Date of Patent: Oct. 17, 2017

(54) TRANSMITTER AND TRANSMISSION METHOD

(71) Applicant: NEC Corporation, Tokyo (JP)

(72) Inventors: Keiichi Motoi, Tokyo (JP); Kazumi Shiikuma, Tokyo (JP); Shinichi Hori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/123,023

(22) PCT Filed: Oct. 29, 2014

(86) PCT No.: PCT/JP2014/078737
§ 371 (c)(1),
(2) Date: Sep. 1, 2016

(87) PCT Pub. No.: WO2015/133003
PCT Pub. Date: Sep. 11, 2015

(65) Prior Publication Data
US 2017/0104456 A1    Apr. 13, 2017

(30) Foreign Application Priority Data
Mar. 6, 2014  (JP) ................................. 2014-043612

(51) Int. Cl.
*H03F 1/02*  (2006.01)
*H03F 3/24*  (2006.01)
(Continued)

(52) U.S. Cl.
CPC ............ *H03F 1/0288* (2013.01); *H03F 3/19* (2013.01); *H03F 3/245* (2013.01); *H04B 1/0475* (2013.01);
(Continued)

(58) Field of Classification Search
USPC ............................ 375/295; 330/149, 297, 10
See application file for complete search history.

(56) References Cited

U.S. PATENT DOCUMENTS 6,472,934 B1 * 10/2002 Pehlke .................. H03F 1/0288
330/10
9,106,316 B2 * 8/2015 Sorrells
(Continued)

FOREIGN PATENT DOCUMENTS

JP    2007-235503 A    9/2007
JP       4974673 B2    7/2012
(Continued)

OTHER PUBLICATIONS

International Search Report corresponding to PCT/JP2014/078737, dated Feb. 3, 2015 (5 pages).
(Continued)

*Primary Examiner* — Eva Puente
(74) *Attorney, Agent, or Firm* — Wilmer Cutler Pickering Hale and Dorr LLP

(57) ABSTRACT

A transmitter according to an exemplary aspect of the present invention includes: a modulation circuit configured to modulate a baseband signal into a multi-bit digital signal including a component in a radio-frequency band; a plurality of switch-mode power amplifiers corresponding to each bit of the multi-bit digital signal output from the modulation circuit; and a signal synthesis circuit including a band limiting unit configured to perform a band limitation on output signals from the plurality of switch-mode power amplifiers, and a plurality of voltage-to-current converting units configured to perform a voltage-to-current conversion on respective output signals from the plurality of switch-mode power amplifiers, the signal synthesis circuit configured to makes a synthesized signal connecting the band limiting unit and the plurality of voltage-to-current convert-
(Continued)

ing units, wherein, depending on an output power at a synthesis point where the synthesized signal is made, a switch-mode power amplifier is selected which is configured to receive input of a pulse, and a pulse number of pulses to be inputted into the selected switch-mode power amplifier is controlled.

20 Claims, 16 Drawing Sheets

(51) Int. Cl.
    *H03F 3/19*        (2006.01)
    *H04B 1/04*        (2006.01)

(52) U.S. Cl.
    CPC .. *H03F 2200/171* (2013.01); *H03F 2200/336* (2013.01); *H03F 2200/451* (2013.01); *H04B 2001/0408* (2013.01)

(56) References Cited

U.S. PATENT DOCUMENTS

| | | |
|---|---|---|
| 2006/0001484 A1 | 1/2006 | Paul et al. |
| 2007/0111685 A1 | 5/2007 | Paul et al. |
| 2011/0175764 A1 | 7/2011 | Booth et al. |
| 2012/0286866 A1* | 11/2012 | Khanifar ............... H03F 1/3247 330/149 |
| 2013/0016795 A1 | 1/2013 | Kunihiro et al. |
| 2015/0222461 A1* | 8/2015 | Motoi .................... H03F 1/565 375/295 |
| 2016/0065138 A1* | 3/2016 | Briffa .................. H03G 3/3042 330/297 |

FOREIGN PATENT DOCUMENTS

| | | |
|---|---|---|
| WO | WO-2011/070952 A1 | 6/2011 |
| WO | WO-2011/088200 A1 | 7/2011 |
| WO | WO-2014/042205 A1 | 3/2014 |

OTHER PUBLICATIONS

Jinseong Jeong and Yuanxun Ethan Wang, "A Polar Delta-Sigma Modulation (PDSM) Scheme for High Efficiency Wireless Transmitters," Microwave Symposium, 2007, IEEE/MTT-S International, Jun. 2007, pp. 73-76.

A. Wentzel et al., "Envelope Delta-Sigma-Modulated Voltage-Mode Class-S PA," Proc. of 42nd European Microwave Conference (EuMC), Sep. 2012, pp. 120-123.

* cited by examiner

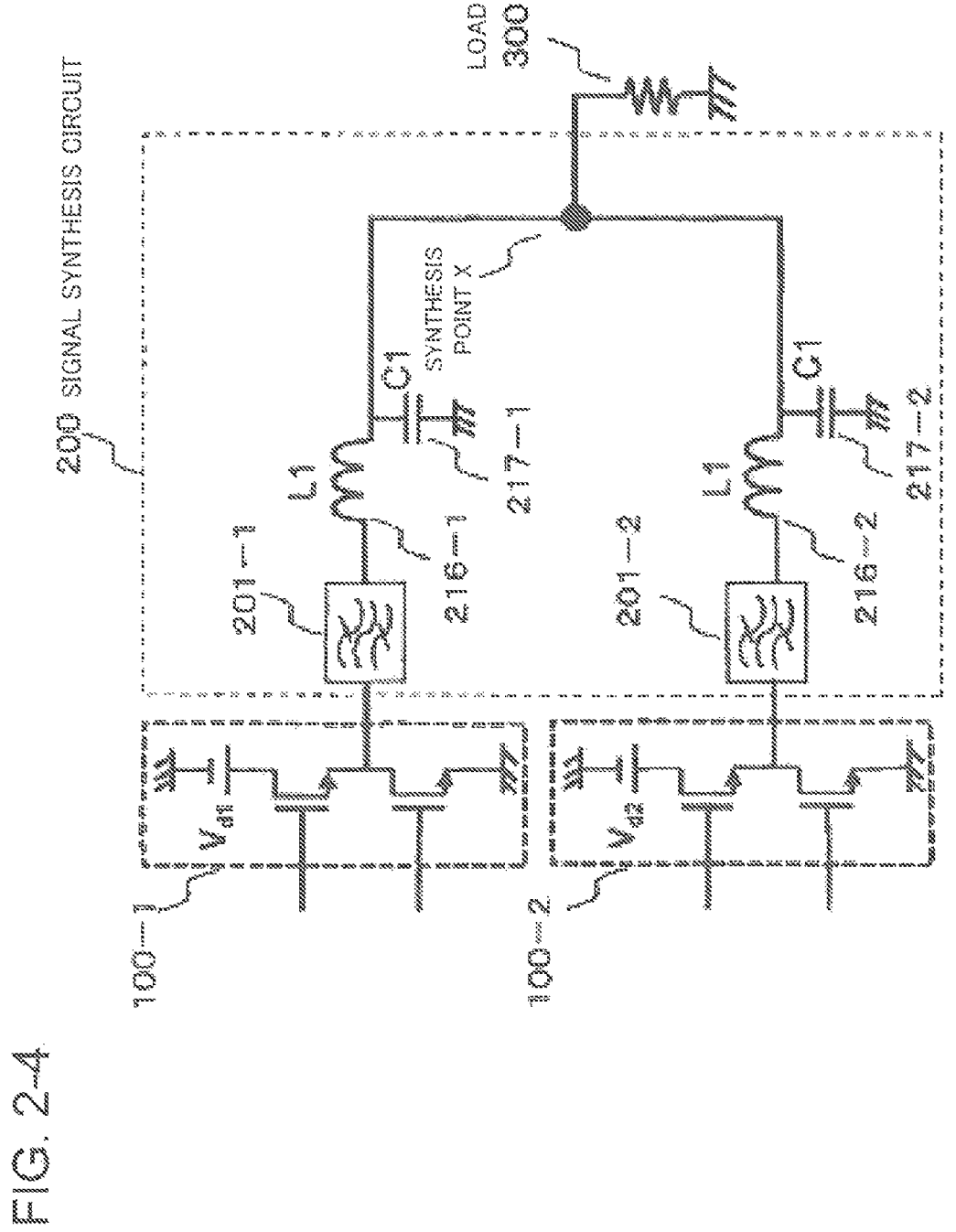
FIG. 2.4

TRANSMITTER AND TRANSMISSION METHOD

CROSS-REFERENCE TO RELATED APPLICATIONS

This application is a national stage application of International Application No. PCT/JP2014/078737 entitled "Transmitter and Transmission Method," filed on Oct. 29, 2014, which claims the benefit of the priority of Japanese Patent Application No. 2014-043612, filed on Mar. 6, 2014, the disclosures of each of which are hereby incorporated by reference in their entirety.

TECHNICAL FIELD

The present invention relates to a transmitter and a transmission method in which a plurality of switch-mode power amplifiers amplify radio-frequency multi-bit digital signals, and output signals from the plurality of switch-mode power amplifiers are synthesized and then output.

BACKGROUND ART

A base station in a wireless communication system transmits signals in which there is a large difference between the average power and the peak power. As a technology to achieve high-efficiency transmission amplifiers used for transmitters in such base stations or the like, a digital transmitter has recently been studied that transforms a transmission signal into a radio-frequency digital transmission signal and amplifies such signal. As a transmission amplifier used for the digital transmitter, switch-mode power amplifiers such as Class-D amplifiers and Class-S amplifiers have been studied (NPL 1 and 2).

The switch-mode power amplifier assumes an input signal to be a pulse-shaped signal and power-amplifies the input signal with maintenance of the pulse shape. The signal amplified by the switch-mode power amplifier has frequency components except the band of the desired radio signal removed, and then it is output from the digital transmitter.

A Doherty amplifier composed of analog amplifiers such as Class-AB amplifiers and Class-C amplifiers is well known as possible means for achieving high efficiency. The Doherty amplifier is composed of a carrier amplifier that operates from a low-power region and a peak amplifier that initiates operations in a stage where the carrier amplifier has reached a saturation region. In general, the carrier amplifier is Class-AB biased, the peak amplifier is Class-C biased, and the peak amplifier becomes off state in the absence of a signal input whose amplitude is larger than a certain level.

In order to maintain high efficiency over a wider range of power levels, a Doherty amplifier as described in PTL 1 is often used that includes a plurality of peak amplifiers whose operation starting points differ from each other. The Doherty amplifier described in PTL 1 is composed of one carrier amplifier and (N−1) peak amplifiers. FIG. 2 in PTL 1 illustrates an example where N is equal to four. In the Doherty amplifier, each of the plurality of peak amplifiers is set at a different bias so that the plurality of respective peak amplifiers may initiate operations sequentially with increasing input amplitude.

PTL 2 proposes an amplifier that includes a plurality of Class-F amplifiers, which ideally operate with a high efficiency of 100% as with Class-D amplifiers, connected through quarter-wave lines, and that synthesizes the output signals of the plurality of Class-F amplifiers (FIG. 1 in PTL 2). The amplifier is designed to improve the efficiency achieving a linear amplifier by synthesizing output signals of the plurality of Class-F amplifiers.

CITATION LIST

Patent Literature

[PTL 1] Japanese Patent No. 4974673
[PTL 2] Japanese Unexamined Patent Application Publication No. 2007-235503

Non Patent Literature

[NPL 1] Jinseong Jeong, Yuanxun Ethan Wang, "A polar Delta-Sigma Modulation (PDSM) Scheme for High Efficiency Wireless Transmitters", Microwave Symposium, 2007. IEEE/MTT-S International, June 2007, pp. 73-76.
[NPL 2] A. Wentzel et al., "Envelope Delta-Sigma-Modulated Voltage-Mode Class-S PA," Proc. of 42nd European Microwave Conference (EuMC), pp. 120-123, September 2012.

SUMMARY OF INVENTION

Technical Problem

In the Doherty amplifier described in PTL 1, (N−1) back-off points become efficiency peak points where the efficiency reaches its local maximum or maximum level. Hereinafter, a point among back-off points at which the efficiency reaches a peak point is referred to as a back-off efficiency peak point. Since the back-off efficiency peak points correspond one-to-one with peak amplifiers, it takes (N−1) peak amplifiers to realize (N−1) back-off efficiency peak points; therefore, there is the problem that the number of amplifying elements increases.

Since the Doherty amplifier described in PTL 1 employs analog amplifiers such as Class-AB and Class-C amplifiers, the maximum upper limit of the ideal efficiency is limited to 78.5%, which is nearly equal to the upper limit of the efficiency of Class-B amplifiers. Accordingly, there is the problem that the efficiency needs further improving.

Since the Doherty amplifier described in PTL 1 employs analog amplifiers such as Class-A and Class-B amplifiers, it is necessary to include a matching circuit for high efficiency and to adjust the matching circuit; therefore, it is necessary to take the trouble to design and adjust matching circuit elements. In addition, the operation starting points of the peak amplifiers can fluctuate under the influence of characteristic variations (variations in threshold values) of transistors used for amplifying elements composing the amplifier. Thus, the Doherty amplifier described in PTL 1 brings about the possibility of the characteristic degradation of the amplifier under the influence of characteristic variations of the amplifying element.

In the configuration of the Class-F amplifier described in PTL 2, amplifying elements in non-active states among the amplifying elements composing the Class-F amplifier do not become grounded states at the higher frequencies; accordingly, the impedance viewed from the synthesis point toward the amplifying element side does not get higher sufficiently. This makes it impossible to provide sufficient isolation between amplifying elements; accordingly, it is difficult to realize the signal synthesis operation according to the present invention as will hereinafter be described in detail.

The Class-F amplifier described in PTL 2 is configured to achieve Class-F impedance conditions for high-order harmonics of a fundamental wave by means of quarter-wave lines connected to the individual amplifying elements. Among those quarter-wave lines, the quarter-wave line connected to the off-state amplifying element functions as a quarter-wave open stub at the synthesis point. This makes it difficult to achieve the matching conditions of a desired fundamental wave.

Thus, the configuration of the Class-F amplifier described in PTL 2 has the problem that it is necessary to put the line into a short circuit condition for the fundamental wave frequency keeping Class-F impedance conditions for the high-order harmonics by means of, for example, providing a new matching circuit for an output end of the amplifying element. In addition, there is the problem that it is essential to include and adjust a matching circuit for achieving high efficiency, and necessary to take the trouble to design and adjust matching circuit elements.

Meanwhile, the switch-mode power amplifiers described in the NPL 1 and NPL 2 have the problem that, if the switch-mode power amplifier is composed of Class-E or Class-F amplifiers, the switching loss due to parasitic capacitance in an amplifying element results in reduced efficiency during low-power operations.

The object of the present invention is to provide a transmitter and a transmission method that can solve any one of the above-described problems.

Solution to Problem

A transmitter according to an exemplary aspect of the present invention includes: a modulation circuit configured to modulate a baseband signal into a multi-bit digital signal including a component in a radio-frequency band; a plurality of switch-mode power amplifiers corresponding to each bit of the multi-bit digital signal output from the modulation circuit; and a signal synthesis circuit including a band limiting unit configured to perform a band limitation on output signals from the plurality of switch-mode power amplifiers, and a plurality of voltage-to-current converting units configured to perform a voltage-to-current conversion on respective output signals from the plurality of switch-mode power amplifiers, the signal synthesis circuit configured to makes a synthesized signal connecting the band limiting unit and the plurality of voltage-to-current converting units, wherein, depending on an output power at a synthesis point where the synthesized signal is made, a switch-mode power amplifier is selected which is configured to receive input of a pulse, and a pulse number of pulses to be inputted into the selected switch-mode power amplifier is controlled.

A transmission method according to an exemplary aspect of the present invention, the transmission method performed by a transmitter including a plurality of switch-mode power amplifiers corresponding to each bit of a multi-bit digital signal, includes: making a synthesized signal connecting a band limiting unit configured to perform a band limitation on output signals from the plurality of switch-mode power amplifiers, and a plurality of voltage-to-current converting units configured to perform a voltage-to-current conversion on respective output signals from the plurality of switch-mode power amplifiers; and selecting a switch-mode power amplifier configured to receive input of a pulse, and controlling a pulse number of pulses to be inputted into the selected switch-mode power amplifier, depending on an output power at a synthesis point where the synthesized signal is made.

Advantageous Effects of Invention

The present invention achieves the effect that it is possible to compose a Doherty amplifier of a few switch-mode power amplifiers and to avoid an increase in the number of amplifying elements.

BRIEF DESCRIPTION OF DRAWINGS

FIG. 2-1 is a diagram illustrating an example configuration of a signal synthesis circuit applied to a Doherty amplifier in accordance with the present invention.

FIG. 2-2 is a diagram illustrating an example configuration of a signal synthesis circuit applied to a Doherty amplifier in accordance with the present invention.

FIG. 2-3 is a diagram illustrating an example configuration of a signal synthesis circuit applied to a Doherty amplifier in accordance with the present invention.

FIG. 2-4 is a diagram illustrating an example configuration of a signal synthesis circuit applied to a Doherty amplifier in accordance with the present invention.

FIG. 3-1 is a diagram illustrating an example configuration of a filter in the signal synthesis circuit applied to a Doherty amplifier in accordance with the present invention.

FIG. 3-2 is a diagram illustrating an example configuration of a filter in the signal synthesis circuit applied to a Doherty amplifier in accordance with the present invention.

FIG. 4 is a diagram illustrating an example configuration of a Doherty amplifier in accordance with a first exemplary embodiment of the present invention.

FIG. 6-1 is a diagram illustrating a schematic configuration and its equivalent circuit in a first operation region of the Doherty amplifier in accordance with the first exemplary embodiment of the present invention.

FIG. 6-2 is a diagram illustrating a schematic configuration and its equivalent circuit in a second operation region of the Doherty amplifier in accordance with the first exemplary embodiment of the present invention.

FIG. 6-3 is a diagram illustrating a schematic configuration and its equivalent circuit in a third operation region of the Doherty amplifier in accordance with the first exemplary embodiment of the present invention.

FIG. 8-1 is a diagram illustrating an example of a signal generating method for an input signal of a switch-mode power amplifier composing the Doherty amplifier in accordance with the first exemplary embodiment of the present invention.

FIG. 8-2 is a diagram illustrating an example of a signal generating method for an input signal of a switch-mode power amplifier composing the Doherty amplifier in accordance with the first exemplary embodiment of the present invention.

DESCRIPTION OF EMBODIMENTS

Figure 1:
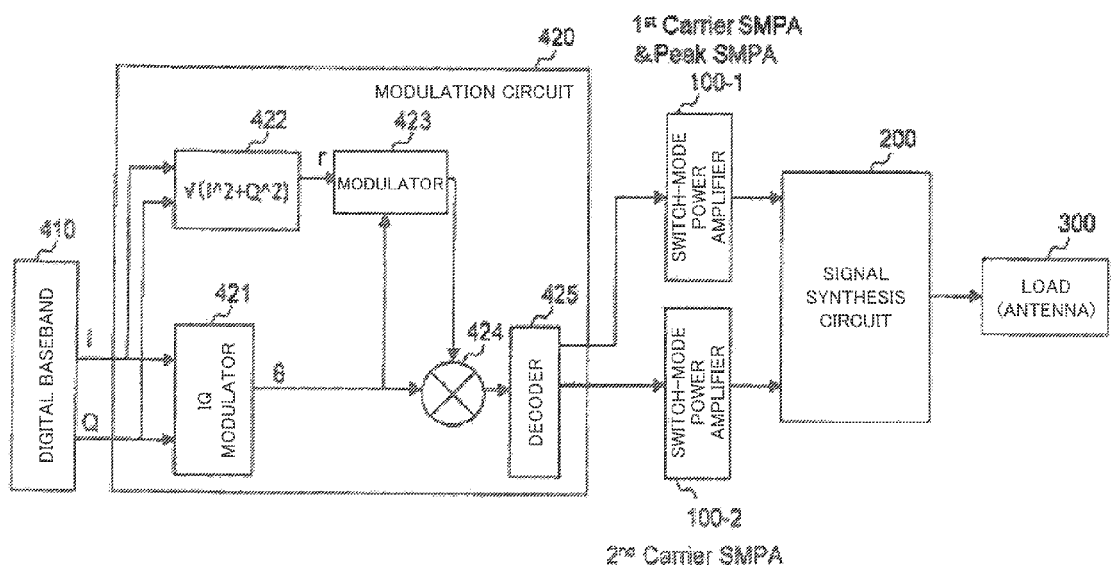
FIG. 1 is a diagram illustrating an example configuration of a transmitter in accordance with the present invention.

Exemplary embodiments of the present invention will be described with reference to the drawings below.

Because the drawings are simplified, the technical scope of the exemplary embodiments should not be interpreted as a narrower scope on the grounds of the description of the drawings. In the drawings, the same reference symbols are used for the same elements, and overlapping descriptions are omitted.

Although the present invention will be described below divided into a plurality of sections or exemplary embodiments if necessary for convenience, those are not unrelated to each other unless particularly specified. That is to say, one section or exemplary embodiment corresponds to a variation example, application example, detail description, supplementary description of a part or whole of another section or exemplary embodiment.

In the following exemplary embodiments, in referring to the number of components or the like (including the number of pieces, numeric value, amount, range, and the like), the number of components is not limited to the number and may include a value greater or less than the number unless otherwise specified or clearly limited to a specific value in principle.

In addition, components (including operation steps and the like) in the following exemplary embodiments are not always essential unless otherwise specified or considered to be clearly essential in principle. Likewise, in the following exemplary embodiments, in referring to shapes or positional relationships and the like of components, what are substantially approximate or similar to the shapes and the like are included unless otherwise specified or clearly considered not to be like that in principle. The same applies to the above-described number and the like (including the number of pieces, numeric value, amount, range, and the like).

FIG. 1 illustrates an example of an entire configuration of a transmitter in accordance with the present invention.

As illustrated in FIG. 1, the transmitter of the present invention includes a digital baseband (hereinafter referred to as DBB) signal generation unit 410, a modulation circuit 420, switch-mode power amplifiers (SMPAs) 100-1 and 100-2, a signal synthesis circuit 200, and a load (antenna) 300.

Wireless signals, taking W-CDMA (wideband code division multiple access) for example, are generated in the DBB signal generation unit 410 as multi-bit, 10-bit or more, DBB signals I, Q.

The DBB signals I, Q are modulated in the modulation circuit 420 into multi-bit digital transmission signals including a component in a radio-frequency band. The modulation circuit 420 is composed of an IQ modulator 421, a converter 422, a modulator 423, a multiplier 424, and a decoder 425.

Generally, the number of bits that can be inputted into Class-D amplifiers is less than that of the DBB signal. Thus, the number of bits of the DBB signal needs decreasing in order that the DBB signal can be inputted into a Class-D amplifier. In general, according to a method of simply dropping lower bits, the quantization noise increases by 6 dB every drop of one bit. A delta-sigma ($\Delta\Sigma$) modulator, which can be used as the modulator 423, is a circuit technology that makes it possible to decrease the number of bits, preventing the quantization noise in a band near the desired frequency from increasing. However, any other modulator than a delta-sigma modulator may be used as the modulator 423.

The DBB signals I, Q are inputted into the IQ modulator 421, and a pulse phase signal $\theta$ is generated that is formed into a rectangular shape in the IQ modulator 421.

The DBB signals I, Q are also inputted into the converter 422, in which the operation of $\sqrt{(I^2+Q^2)}$ is performed on the DBB signals, and an amplitude signal r is generated.

The amplitude signal r is modulated in the modulator 423. The number of bits of an output signal from the modulator 423 is set to be equal to the number of bits that can be inputted into Class-D amplifiers in a subsequent stage. In FIG. 1, since two switch-mode power amplifiers 100-1 and 100-2 are set as Class-D amplifiers, the number of bits that can be inputted is two.

The output signal from the modulator 423 is multiplied by the pulse phase signal $\theta$ formed into a rectangular shape in the multiplier 424, and a multi-bit digital transmission signal (two bits in FIG. 1) is generated that includes a component of the desired radio-frequency band. Because the high level of the pulse phase signal $\theta$, which has been formed into a rectangular shape, is allocated to 1, and the low level of it is allocated to 0, the number of bits of the output signal from the multiplier 424 is equal to the number of bits of the output signal from the modulator 423.

The digital transmission signals generated in the multiplier 424 are inputted into the switch-mode power amplifiers 100-1 and 100-2 through the decoder 425.

In FIG. 1, two switch-mode power amplifiers 100-1 and 100-2 and the signal synthesis circuit 200 composes a Doherty amplifier. Here, the switch-mode power amplifier 100-1 is defined as a first carrier switch-mode power amplifier and a peak switch-mode power amplifier, and the switch-mode power amplifier 100-2 is defined as a second carrier switch-mode power amplifier.

A signal on the most significant bit (MSB) side of the digital transmission signal is inputted from the decoder 425 into the switch-mode power amplifier 100-1, which is a Class-D amplifier with a power-supply voltage $V_{d1}$, which amplifies the inputted signal.

A signal on the least significant bit (LSB) side of the digital transmission signal is inputted from the decoder 425 into the switch-mode power amplifier 100-2, which is a Class-D amplifier with a power-supply voltage $V_{d2}$ ($V_{d1} < V_{d2}$), which amplifies the inputted signal.

The output signals from the two switch-mode power amplifiers 100-1 and 100-2 are synthesized in the signal synthesis circuit 200, and the synthesized signal is transmitted through the load (antenna) 300.

FIGS. 2-1 to 2-4 illustrate examples of a specific configuration of the signal synthesis circuit 200.

As illustrated in FIGS. 2-1 to 2-4, the signal synthesis circuit 200 makes a synthesized signal at a synthesis point X from the output signal of the MSB-side switch-mode power amplifier 100-1 and the output signal of the LSB-side switch-mode power amplifier 100-2, and then supplies the synthesized signal to the load 300.

Figures 1, 2:
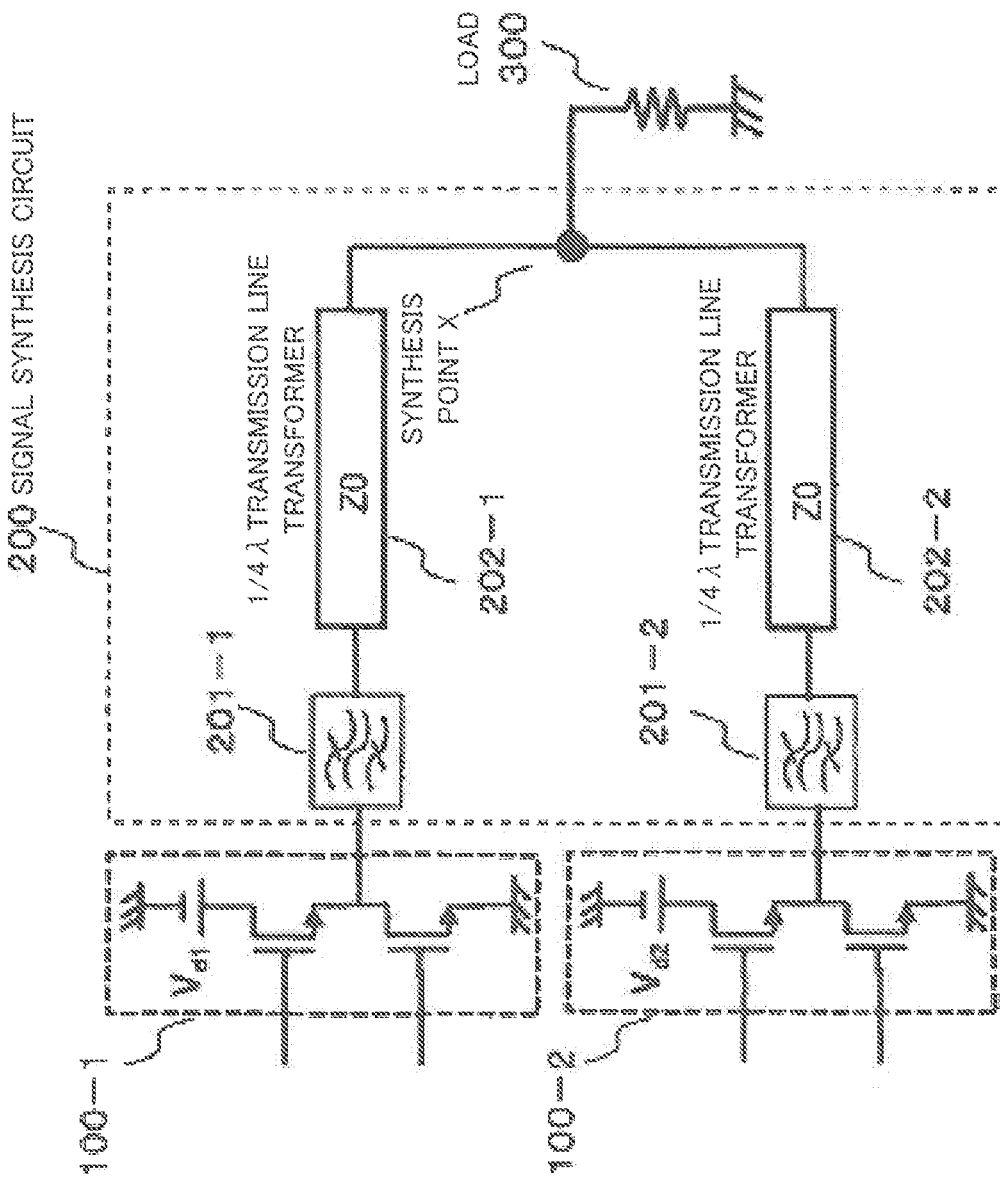
Figure 2:
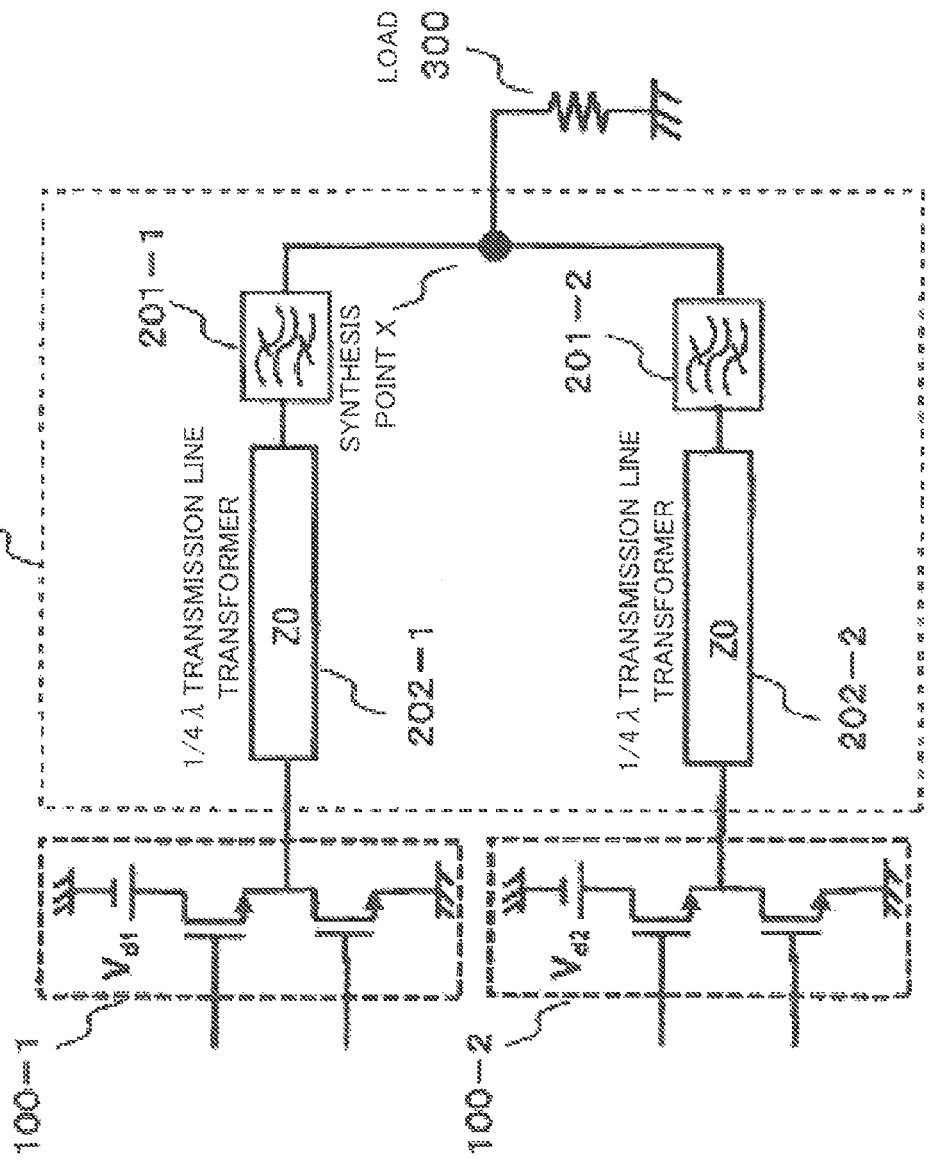

The signal synthesis circuit 200 illustrated in one of FIG. 2-1 and FIG. 2-2 includes a filter 201-1 and a quarter-wave transmission line transformer 202-1 disposed on the signal path between the switch-mode power amplifier 100-1 and the synthesis point X. A filter 201-2 and a quarter-wave transmission line transformer 202-2 are disposed on the signal path between the switch-mode power amplifier 100-2 and the synthesis point X. FIG. 2-1 differs from FIG. 2-2 in interchanging the filter 201-1 and the quarter-wave transmission line transformer 202-1 and in interchanging the filter 201-2 and the quarter-wave transmission line transformer 202-2. In those configurations, each of the quarter-wave transmission line transformers 202-1 and 202-2 composes a voltage-to-current converting unit. Each of the filters 201-1 and 201-2 composes a band limiting unit.

Figures 2, 3:
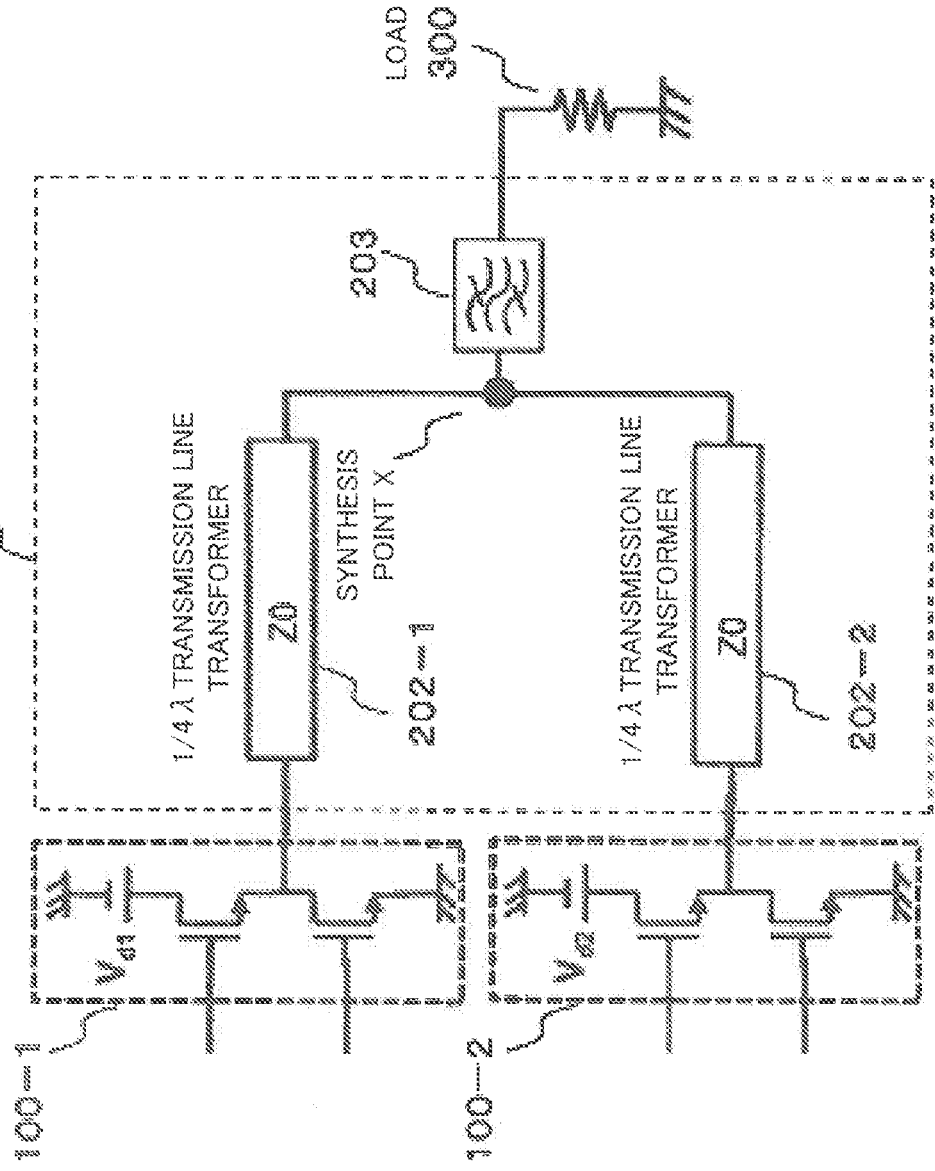
Figures 1, 3:
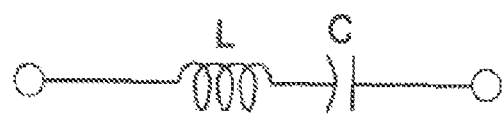
Figures 2, 3:
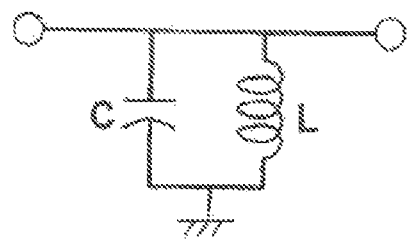

The signal synthesis circuit 200 illustrated in FIG. 2-3, compared with the configuration in FIG. 2-1, is configured in which the filters 201-1 and 201-2 are eliminated, and instead a filter 203 is included disposed on the signal path between the synthesis point X and the load 300. In this configuration, the filter 203 composes a band limiting unit.

Figure 4:
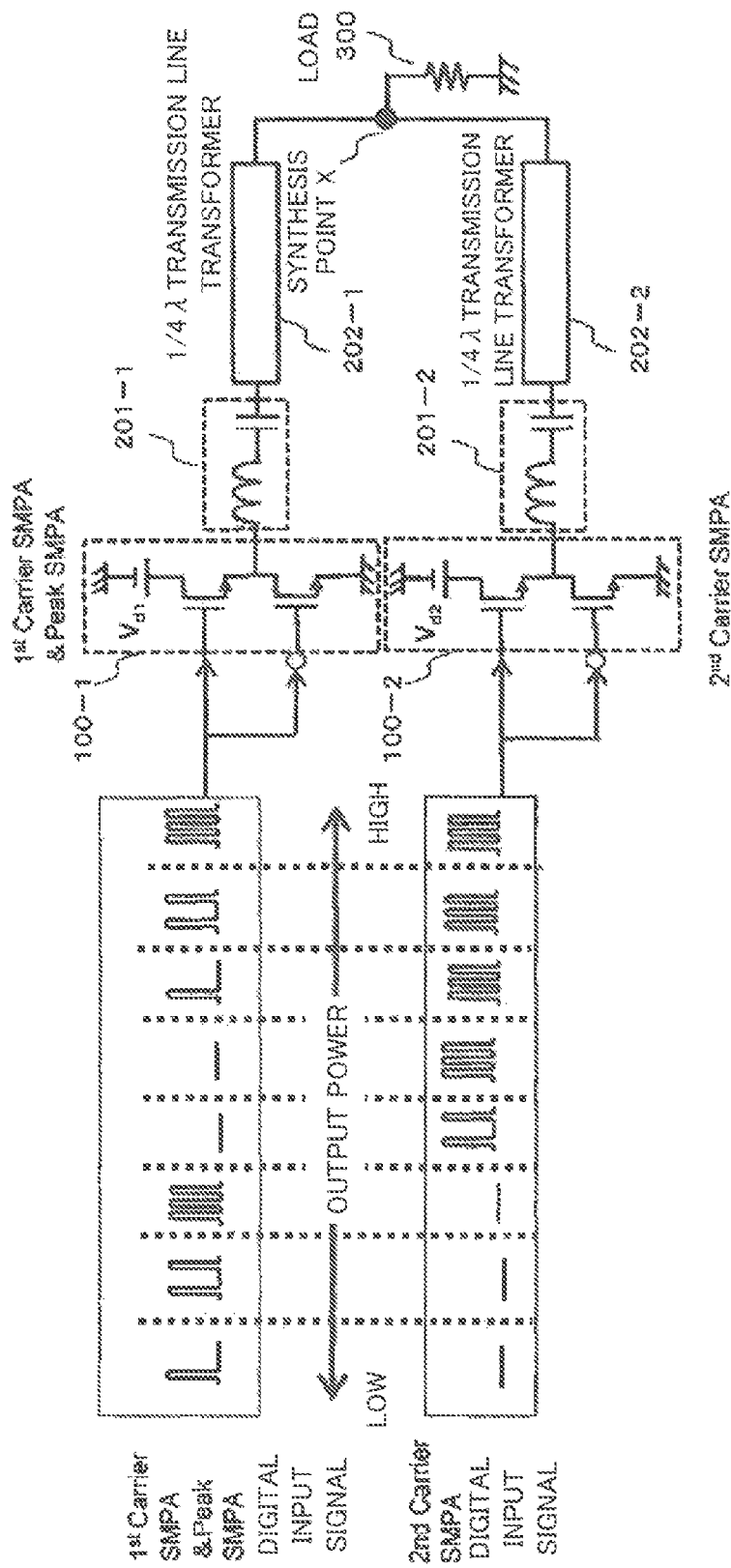

The signal synthesis circuit 200 illustrated in FIG. 2-4, compared with the configuration in FIG. 2-1, includes an inductor 216-1 and a capacitor 217-1 instead of the quarter-wave transmission line transformer 202-1, and includes an inductor 216-2 and a capacitor 217-2 instead of the quarter-wave transmission line transformer 202-2. More specifically, the inductor 216-1 is connected in series to the signal path between the switch-mode power amplifier 100-1 and the synthesis point X, and the capacitor 217-1 is connected in parallel to the signal path in a stage following the inductor 216-1. The inductor 216-2 is connected in series to the signal path between the switch-mode power amplifier 100-2 and the synthesis point X, and the capacitor 217-2 is connected in parallel to the signal path in a stage following the inductor 216-2. In this configuration, the inductor 216-1 and the capacitor 217-1 compose a voltage-to-current converting unit, and the inductor 216-2 and the capacitor 217-2 compose a voltage-to-current converting unit.

In the signal synthesis circuit 200 illustrated in FIG. 2-4, the inductor 216-1 and the capacitor 217-1 may be interchanged, and the inductor 216-2 and the capacitor 217-2 may be interchanged.

The operations on the MSB side (the switch-mode power amplifier 100-1 side) will be described below using the signal synthesis circuit 200 in FIG. 2-1 as a representative example.

The switch-mode power amplifier 100-1 is configured to insert two switch elements in series between a ground line and a power source with a power-supply voltage $V_{d1}$, and the two switch elements are controlled so that either one of them may turn to an on-state.

Accordingly, the output voltage of the switch-mode power amplifier 100-1 becomes equal to the power-supply voltage $V_{d1}$ when the switch element on the power supply side is on-state and the switch element of the ground side is off-state, or it becomes equal to the ground potential in the reverse case. For this reason, the switch-mode power amplifier 100-1 is equivalently grounded at the higher frequencies in either case of the state of the switch, and the switch-mode power amplifier 100-1 can be regarded as a voltage source with a low output impedance.

The filter 201-1 limits the band of the output signal from the switch-mode power amplifier 100-1, lets through the signals only having a frequency near to the fundamental wave frequency, and reflects the signals in the other frequency domain. In particular, the filter totally reflects harmonic signals.

It is desirable to use an LC filter, for example, as the filter 201-1, specifically, to use an LC series-resonant circuit where an inductor and a capacitor are connected serially, as illustrated in FIG. 3-1.

The quarter-wave transmission line transformer 202-1 converts the voltage of the output signal from the filter 201-1 into an electric current I1 and outputs the electric current.

Similar operations are performed on the LSB side (on the switch-mode power amplifier 100-2 side), and an electric current I2 is output from the quarter-wave transmission line transformer 202-2.

Consequently, it is possible to cause synthesis of the output signals from the switch-mode power amplifiers 100-1 and 100-2 by making a current synthesis of the electric current I1 output from the MSB side and the electric current I2 output from the LSB side at the synthesis point X.

The impedance at the neighboring frequency of the fundamental wave in a stage preceding the synthesis point X is fixed at the on/off timing of the switch element included in the switch-mode power amplifiers 100-1 and 100-2. The switch-mode power amplifiers 100-1 and 100-2 can be regarded as a voltage source with a low output impedance at the higher frequencies regardless of the state of the switch element. As a result, the signal synthesis circuit 200 becomes equivalent to a circuit where a current source of the current I1 and a current source of the current I2 are connected to the synthesis point X due to the voltage-to-current converting function of the quarter-wave transmission line transformer 202-1 or 202-2 that is connected to a stage following the switch-mode power amplifier 100-1 or 100-2. Accordingly, the isolation from other ports can be provided on each port of the synthesis point X.

In this way, it becomes possible to make the individual switch-mode power amplifiers 100-1 and 100-2 operate independently due to the isolation from the other ports, and to perform Doherty amplification operations mentioned below.

In the signal synthesis circuit 200 in any of FIGS. 2-1 to 2-4, an LC parallel resonant circuit where a capacitor and an inductor are connected in parallel as illustrated in FIG. 3-2 can be also used as the filter 201-1, 202-1, or 203.

However, it is desirable in the signal synthesis circuit 200 in FIG. 2-4 to use the LC series resonant circuit as illustrated in FIG. 3-1 as each of the filters 201-1 and 202-1. In the signal synthesis circuits 200 in FIGS. 2-2 and 2-3, it is desirable to use an LC parallel resonant circuit as illustrated in FIG. 3-2 as the filter 201-1, 202-1, or 203.

Based on the configurations described above, a Doherty amplifier in a transmitter in accordance with exemplary embodiments of the present invention will be described below.

(1) A First Exemplary Embodiment

FIG. 4 illustrates an example configuration of a Doherty amplifier in a transmitter in accordance with the present exemplary embodiment, and pulse waveforms of digital input signals inputted into each of the switch-mode power amplifiers 100-1 and 100-2 which compose the Doherty amplifier.

It is assumed that the DBB signal generation unit 410 and the modulation circuit 420 illustrated in FIG. 1 are disposed in a stage preceding the configuration illustrated in FIG. 4 (the same applies to the following FIGS. 6-1 to 6-3 and FIG. 9).

Although the signal synthesis circuit 200 illustrated in FIG. 2-1 is adopted in the configuration of FIG. 4, the other configurations described above (the configurations in FIGS. 2-2 to 2-4 or a configuration interchanging the inductor and the capacitor in FIG. 2-4) may also be used as the signal synthesis circuit 200.

As illustrated in FIG. 4, the transmitter in accordance with the present exemplary embodiment makes a synthesized signal at the synthesis point X from the outputs signals from two switch-mode power amplifiers whose power-supply voltages differ from each other (the switch-mode power amplifier 100-1 with a power-supply voltage $V_{d1}$ and the switch-mode power amplifier 102 with a power-supply voltage $V_{d2}$, where $V_{d1}<V_{d2}$), and then supplies the synthesized signal to the load 300.

Here, the switch-mode power amplifier 100-1 is defined as a first carrier switch-mode power amplifier and a peak switch-mode power amplifier, and the switch-mode power amplifier 100-2 is defined as a second carrier switch-mode power amplifier.

In the present exemplary embodiment, the digital input signals inputted into the switch-mode power amplifiers 100-1 and 100-2 are pulse waveform signals having the pulse waveforms as illustrated in FIG. 4.

An input code, having a pulse width Tc/2 and a pulse interval $\Delta T=Tc$ (Tc=1/f0, where f0 representing the fundamental wave frequency of the digital input signal) among input codes inputted into the switch-mode power amplifiers 100-1 and 100-2 as the digital input signal, is defined as a saturation code. Using the saturation code as a reference, a pulse decimation ratio D of a pulse is defined as a ratio of the number of decimated pulses from the saturation code.

Figure 5:
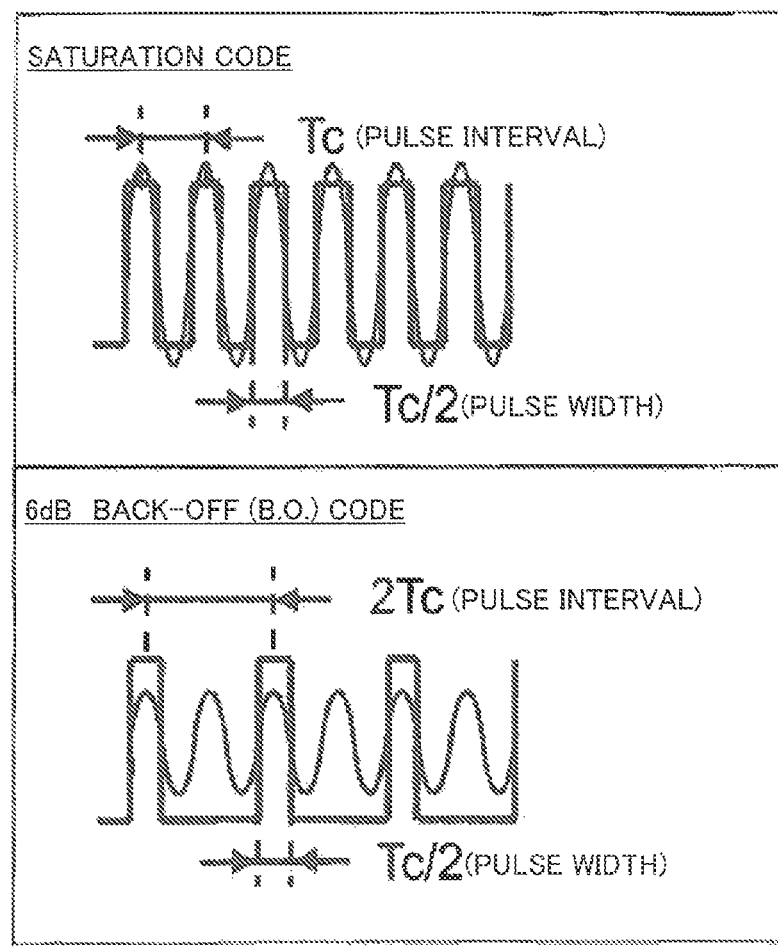
FIG. 5 is a diagram for illustrating pulse widths and pulse intervals of pulses in input signals of each switch-mode power amplifier composing the Doherty amplifier in accordance with the first and second exemplary embodiments of the present invention.

Specifically, for example, the 6 dB back-off input signal illustrated in FIG. 5 corresponds to a signal obtained by decimating five pulse trains from ten pulse trains of the saturation code. In this case, the pulse decimation ratio D becomes equal to 0.5, that is, D=5 pieces/10 pieces). The sine waves illustrated in FIG. 5 along with the pulses represent waveforms of desired frequency components included in the pulses. Focusing attention on the waveform of the sine wave, the amplitude varies depending on the pulse decimation ratio; therefore, it can be seen that the amplitude is weighted by the pulse decimation ratio.

In the present exemplary embodiment, the switch-mode power amplifiers 100-1 and 100-2 have the relationship that the output power is proportional to the square of the amplitude value of a desired frequency component included in the digital input signal, ideally. And so, using as a reference the output power at the input time of the saturation code (pulse decimation ratio D=0) when the maximum output power is output, a back-off index M is defined as follows:

$$M=-20 \log(1-D) \quad \text{[Formula 1]}$$

A digital input signal with a pulse decimation ratio D is hereinafter referred to as M dB—back-off code using the back-off index M; however, as a saturation code if D is equal to 0, and as an off code if D is equal to 1.

The present exemplary embodiment is characterized by a method of inputting back-off codes into the switch-mode power amplifiers 100-1 and 100-2, corresponding to a magnitude of the output power of the Doherty amplifier (that is, the output power at the synthesis point X in FIG. 4). Specifically, the present exemplary embodiment is characterized by controlling the number of pulses to be inputted into the switch-mode power amplifiers 100-1 and 100-2, and more specifically, by controlling the pulse decimation ratio.

Since the present exemplary embodiment has the above-described features, two back-off efficiency peak points can be formed by the two switch-mode power amplifiers 100-1 and 100-2 as described below.

In contrast, the Doherty amplifier described in PTL 1 has required two peak amplifiers to form two back-off efficiency peak points; accordingly, at least three amplifiers including a carrier amplifier have been required.

According to the present exemplary embodiment, therefore, it is possible to form two back-off efficiency peak points by fewer switch-mode power amplifiers compared with the Doherty amplifier described in PTL 1.

A method of inputting back-off codes will be described below according to the present exemplary embodiment to form two back-off efficiency peak points by the two switch-mode power amplifiers 100-1 and 100-2.

Here, an output power region up to a first back-off efficiency peak point is referred to as a first operation region, an output power region up to a second back-off efficiency peak point is referred to as a second operation region, and an output power region up to the final saturation efficiency peak point is referred to as a third operation region.

Figures 1, 6:
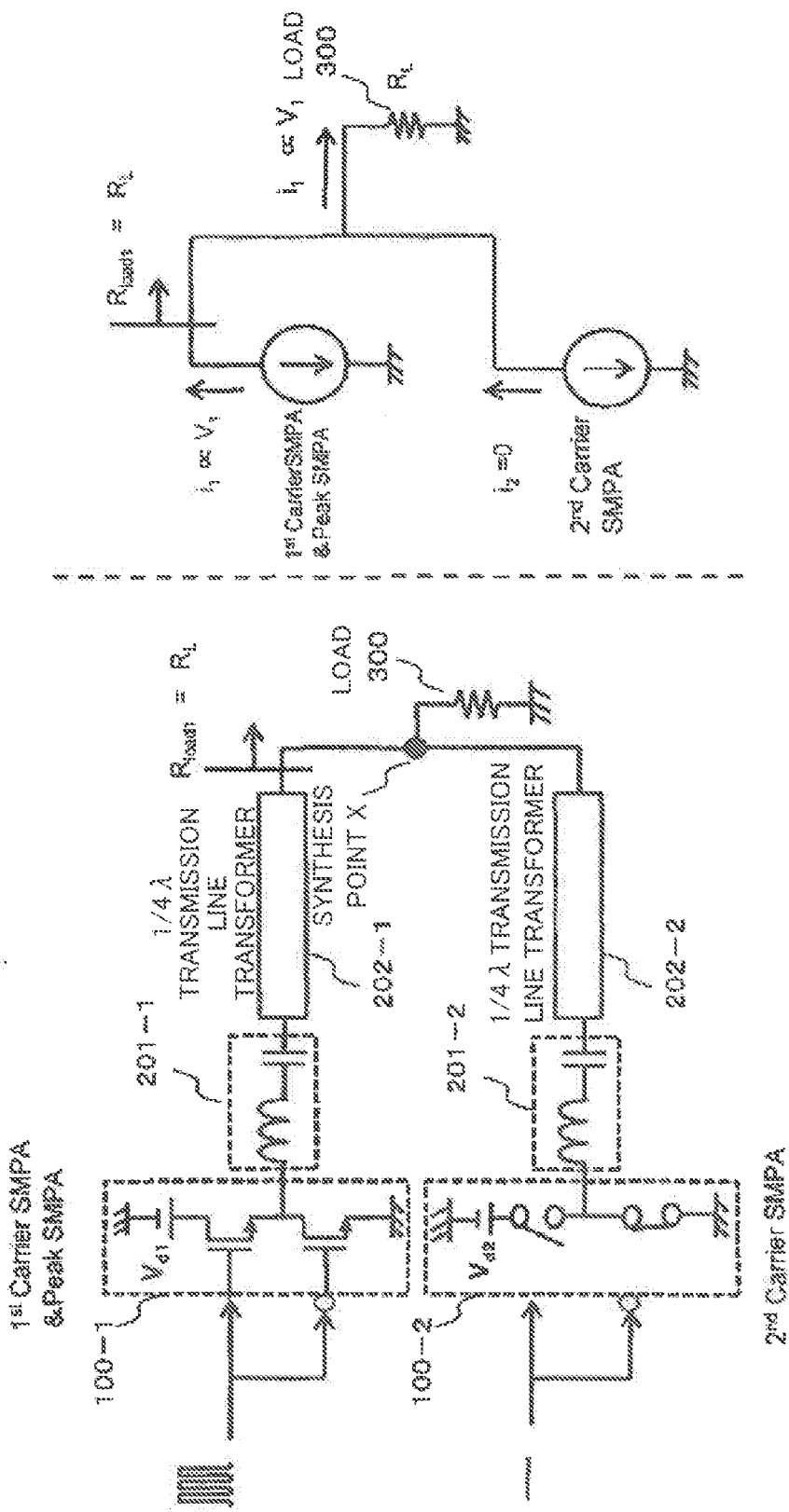
Figures 2, 6:
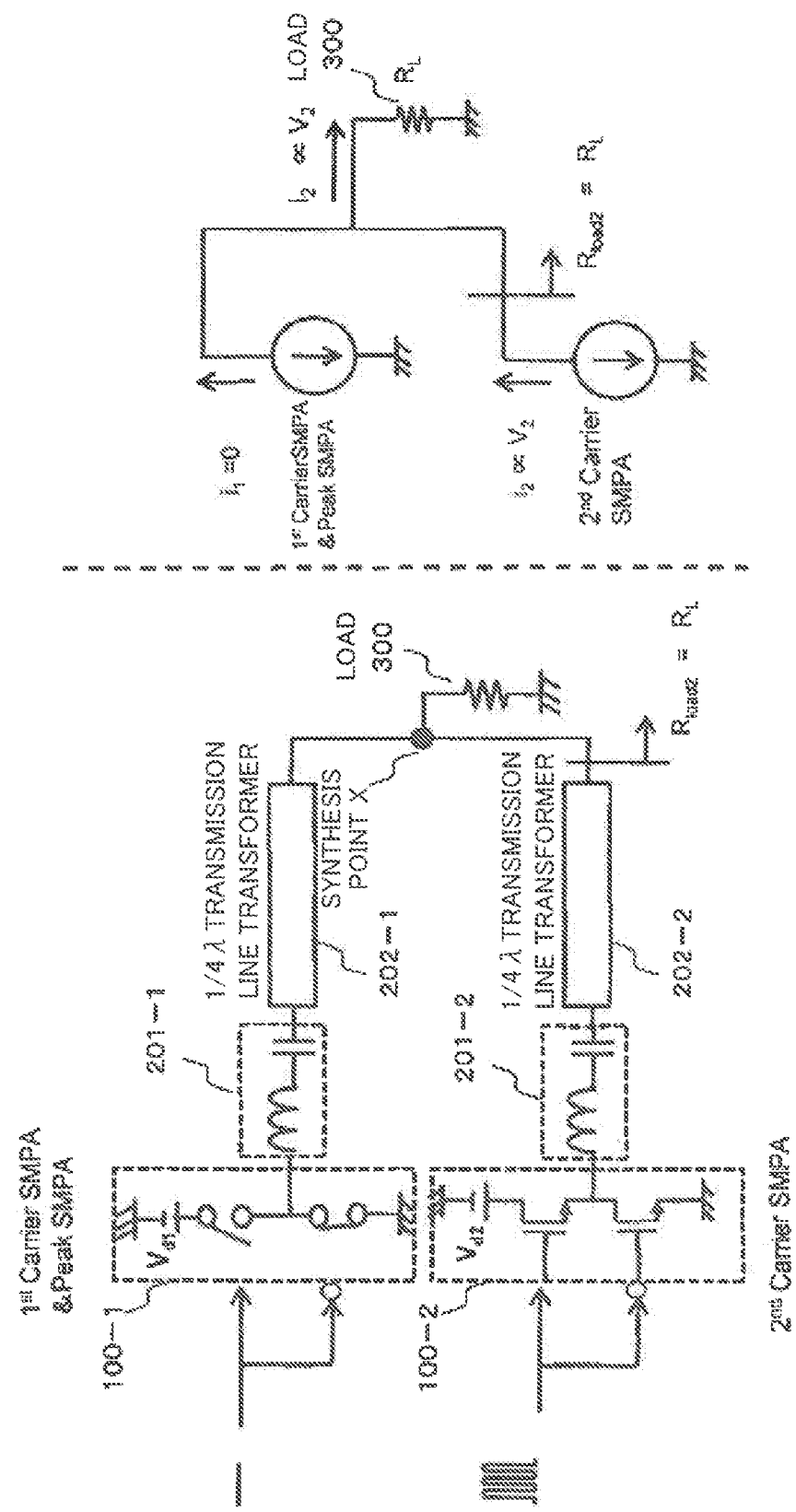
Figures 3, 6:
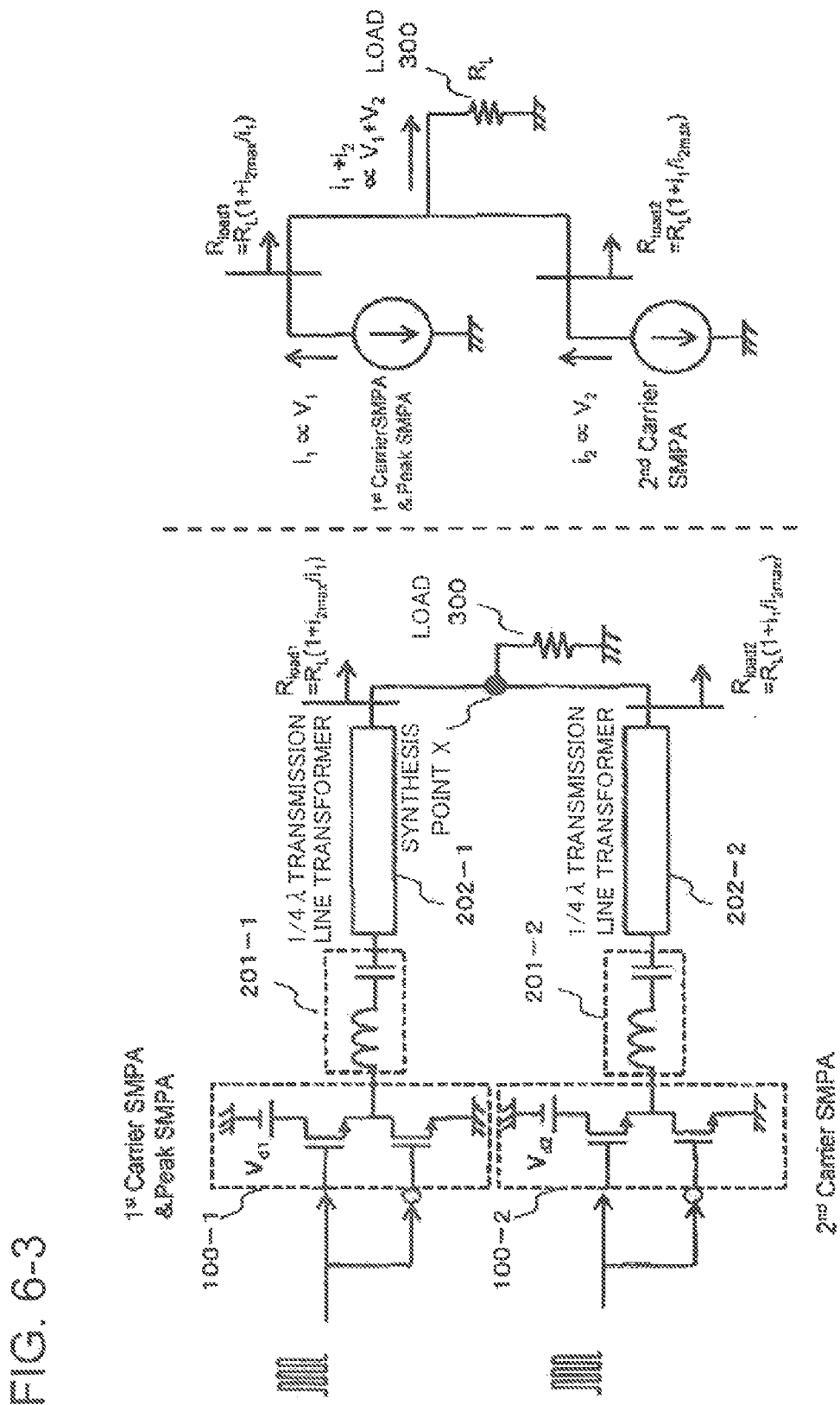

FIGS. 6-1 to 6-3 illustrate schematic configurations of the Doherty amplifier according to the present exemplary embodiment, and their equivalent circuits, with respect to each operation region. These equivalent circuits are expressed by transforming respective components located from the switch-mode power amplifiers 100-1 and 100-2 to the synthesis point X into an equivalent current source. FIGS. 6-1, 6-2, and 6-3 illustrate configurations corresponding to the first operation region, the second operation region, and the third operation region, respectively.

In the first operation region (FIG. 6-1), a digital input signal whose pulse decimation ratio D satisfies the formula of 0 (saturation code)≤D≤1 (off code) is inputted into the switch-mode power amplifier 100-1 only. Meanwhile, the switch-mode power amplifier 100-2 is put into an off state by inputting an off code signal whose pulse decimation ratio D satisfies the formula of D=1, or alternatively by connecting it to ground using other control methods. That is to say, the switch-mode power amplifier 100-1 only is made to operate, and is used as a first carrier switch-mode power amplifier.

At this time, the impedance $R_{load1}$ viewing the load 300 side from the output end of the quarter-wave transmission line transformer 202-1 is equivalent to the impedance of the load 300, that is, the formula of $R_{load1}=R_Z$ is satisfied. The impedance $Z_{load1}$ viewing the load 300 side from the output end of the switch-mode power amplifier 100-1 undergoes impedance conversion by the quarter-wave transmission line transformer 202-1 (its characteristic impedance represented by $Z_0$), resulting in the following.

$$Z_{load1} = \frac{Z_0^2}{R_{load1}} = \frac{Z_0^2}{R_L} \quad \text{[Formula 2]}$$

Thus, the maximum output power $P_{out1}$ and the current $I_{1max}$ flowing through the load 300 corresponding to it are expressed respectively as follows:

$$P_{out1} = \frac{V_{d1}^2}{2Z_{load1}} = \frac{R_L}{2}\left(\frac{V_{d1}}{Z_0}\right)^2 \quad \text{[Formula 3]}$$

$$I_{1max} = \left(\frac{P_{out1}}{R_L}\right)^{0.5} = \frac{1}{\sqrt{2}}\left(\frac{V_{d1}}{Z_0}\right)$$

In the second operation region (FIG. 6-2), a digital input signal whose pulse decimation ratio D satisfies the formula of 0 (saturation code)≤D<DC1 (where DC1 is set at a pulse decimation ratio by which output power greater than $P_{out1}$ is obtained) is inputted into the switch-mode power amplifier 100-2 only. Meanwhile, the switch-mode power amplifier 100-1 is put into an off state by inputting an off code signal whose pulse decimation ratio D satisfies the formula of D=1, or alternatively by connecting it to ground using other control methods. That is to say, the switch-mode power amplifier 100-2 only is made to operate, and is used as a second carrier switch-mode power amplifier.

At this time, the impedance $R_{load2}$ viewing the load 300 side from the output end of the quarter-wave transmission line transformer 202-2 is equivalent to the impedance of the load 300, that is, the formula of $R_{load2}=R_Z$ is satisfied. The impedance $Z_{load2}$ viewing the load 300 side from the output end of the switch-mode power amplifier 100-2 undergoes impedance conversion by the quarter-wave transmission line transformer 202-2 (its characteristic impedance represented by $Z_0$), resulting in the following.

$$Z_{load2} = \frac{Z_0^2}{R_{load2}} = \frac{Z_0^2}{R_L} \qquad \text{[Formula 4]}$$

Thus, the maximum output power $P_{out2}$ and the current $I_{2max}$ flowing through the load 300 corresponding to it are expressed respectively as follows:

$$P_{out2} = \frac{V_{d2}^2}{2Z_{load2}} = \frac{R_L}{2}\left(\frac{V_{d2}}{Z_0}\right)^2 = 2R_L\left(\frac{V_{d1}}{Z_0}\right)^2 \qquad \text{[Formula 5]}$$

$$I_{2max} = \left(\frac{P_{out2}}{R_L}\right)^{0.5} = \frac{1}{\sqrt{2}}\left(\frac{V_{d2}}{Z_0}\right)$$

In the third operation region (FIG. 6-3), a digital input signal whose pulse decimation ratio D satisfies the formula of D=0 (saturation code) is inputted into the switch-mode power amplifier 100-2, and a digital input signal whose pulse decimation ratio D satisfies the formula of 0 (saturation code)≤D<1 (off code) is inputted into the switch-mode power amplifier 100-1. That is to say, the switch-mode power amplifier 100-2 is used as a second carrier switch-mode power amplifier, and the switch-mode power amplifier 100-1 is used as a peak switch-mode power amplifier.

At this time, the impedance $R_{load1}$ and the impedance $R_{load2}$ viewing the load 300 side from the output ends of the quarter-wave transmission line transformers 202-1 and 202-2 are expressed respectively as follows:

$$R_{load1} = \frac{V_{out}}{i_1} = \frac{R_L(i_1+i_{2max})}{i_1} = R_L\left(1+\frac{i_{2max}}{i_1}\right) \qquad \text{[Formula 6]}$$

$$R_{load2} = \frac{V_{out}}{i_2} = \frac{R_L(i_1+i_{2max})}{i_{2max}} = R_L\left(1+\frac{i_1}{i_{2max}}\right)$$

Thus, a load modulation arises where $R_{load1}$ and $R_{load2}$ fluctuate depending on the operating state of the switch-mode power amplifier 100-1 that serves as a peak switch-mode power amplifier.

If the formula of $V_{d2}=2V_{d1}$ is satisfied, because of $i_{2max}=2i_{1max}$, $Z_{load1}$ and $Z_{load2}$ are expressed respectively when $i_1 \to i_{1max}$ as follows:

$$Z_{load1} = \frac{Z_0^2}{R_{load1}} = \frac{Z_0^2}{R_L\left(1+\frac{i_{2max}}{i_1}\right)} \to \frac{Z_0^2}{3R_L} \qquad \text{[Formula 7]}$$

-continued $$Z_{load2} = \frac{Z_0^2}{R_{load2}} = \frac{Z_0^2}{R_L\left(1+\frac{i_1}{i_{2max}}\right)} \to \frac{Z_0^2}{1.5R_L}$$

Hence, the maximum output power $P_{out}$ is expressed as follows:

$$P_{out} = \frac{V_{d1}^2}{2Z_{load1}} + \frac{V_{d2}^2}{2Z_{load2}} \qquad \text{[Formula 8]}$$

$$= \frac{V_{d1}^2}{2Z_0^2/3R_L} + \frac{V_{d2}^2}{2Z_0^2/1.5R_L}$$

$$= \left(\frac{3}{2} + 4 \times \frac{1.5}{2}\right)R_L\left(\frac{V_{d1}}{Z_0}\right)^2 = 4.5R_L\left(\frac{V_{d1}}{Z_0}\right)^2$$

Accordingly, $P_{out1}$ and $P_{out2}$ are expressed respectively as follows:

$$P_{out1} = \frac{1}{9}P_{out}, \quad P_{out2} = \frac{4}{9}P_{out} \qquad \text{[Formula 9]}$$

Consequently, the first back-off efficiency peak point is located at the back-off point that is expressed as follows:

$$-10 \log(1/9) = 9.5 \text{ dB} \qquad \text{[Formula 10]}$$

The second back-off efficiency peak point is located at the back-off point that is expressed as follows:

$$-10 \log(4/9) = 3.5 \text{ dB} \qquad \text{[Formula 11]}$$

Figure 7:
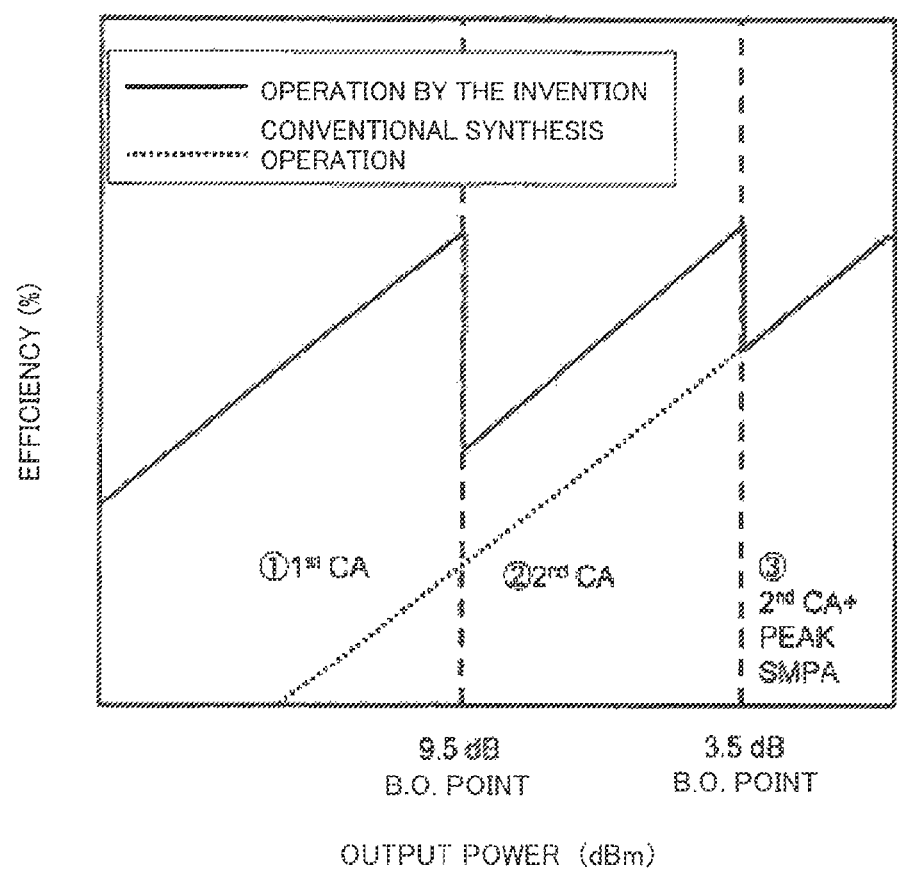
FIG. 7 is a diagram illustrating output and efficiency characteristics of the Doherty amplifier in accordance with the first exemplary embodiment of the present invention.

FIG. 7 illustrates output and efficiency characteristics expressing the efficiency against the output power of the Doherty amplifier (that is, the output power at the synthesis point X in FIG. 4) in the transmitter according to the present exemplary embodiment.

As illustrated in FIG. 7, the above-described method for inputting back-off codes enables the Doherty amplifier configured to include two switch-mode power amplifiers 100-1 and 100-2 to have two back-off efficiency peaks.

Although the present exemplary embodiment assumes $V_{d2}=2V_{d1}$, two back-off efficiency peak points can be adjusted by changing the power-supply voltage ratio between $V_{d1}$ and $V_{d2}$.

The following describes a signal generating method, in the DBB signal generation unit 410, to achieve the operation according to the present exemplary embodiment.

Figures 1, 8:
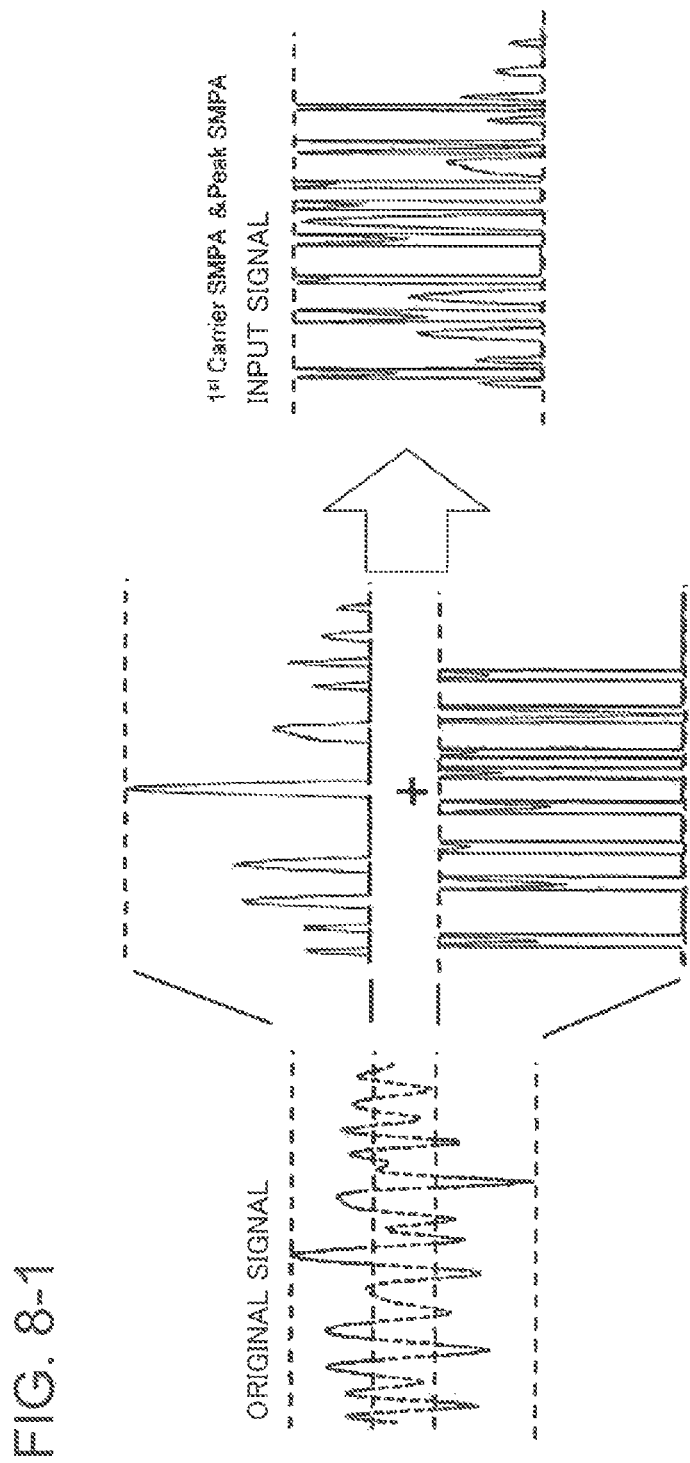
Figures 2, 8:
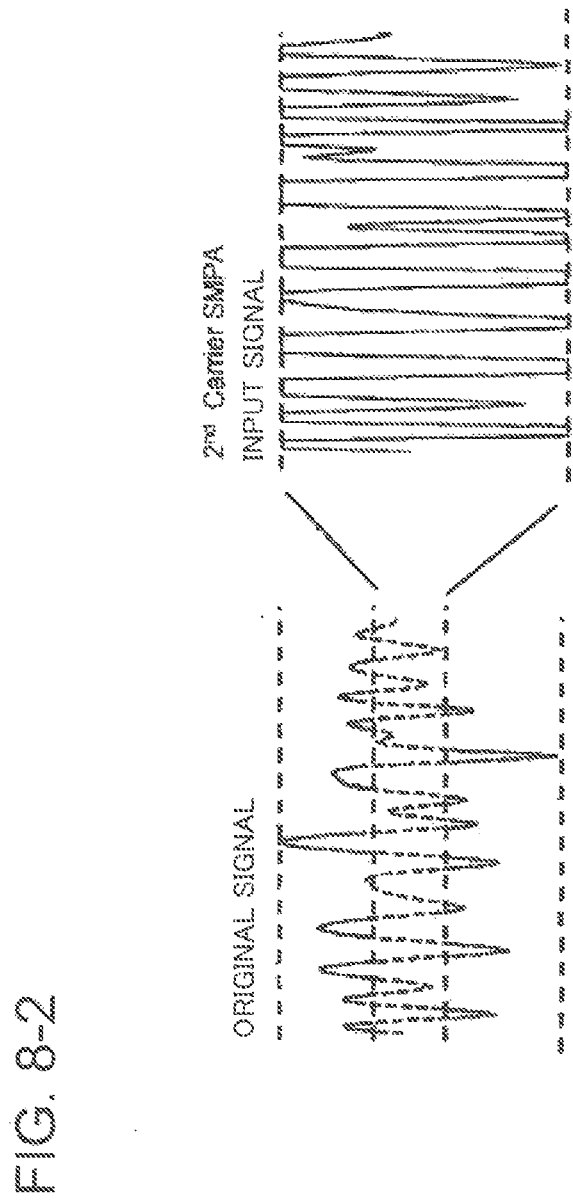

FIG. 8-1 illustrates an example of generating a digital input signal to be inputted into the switch-mode power amplifier 101-1 from an original signal, and FIG. 8-2 illustrates an example of generating a digital input signal to be inputted into the switch-mode power amplifier 101-2 from the original signal.

Specifically, the amplitudes of the original signal $V_{in}(t)$ are separated into the following three regions that correspond to the output power of the Doherty amplifier. A corresponding formula is set for each of the three regions.

Thus, the original signal $V_{in}(t)$ is converted into $V_{in\_CA1}(t)$ and $V_{in\_CA2}(t)$ using a formula that is determined according to which of the three regions the amplitude of the original signal $V_{in}(t)$ corresponds to. Here, $V_{in\_CA1}(t)$ and $V_{in\_CA2}(t)$ represent digital input signals, that is, digital signals to be inputted into the switch-mode power amplifiers 101-1 and 101-2, respectively.

$$V_{in_{CA1}}(t) = \frac{(V_{in}(t) - \alpha_2)}{(1 - \alpha_2)} \quad (\alpha_2 < V_{in} < 1)$$
$$= 0 \quad (\alpha_1 < V_{in} \leq \alpha_2)$$
$$= V_{in}(t)/\alpha_1 \quad (V_{in} \leq \alpha_1)$$

$$V_{in_{CA2}}(t) = 1 \quad (\alpha_2 < V_{in} < 1)$$
$$= \frac{(V_{in}(t) - \alpha_1)}{(\alpha_2 - \alpha_1)} \quad (\alpha_1 < V_{in} \leq \alpha_2)$$
$$= 0 \quad (V_{in} \leq \alpha_1)$$

[Formula 12]

Then converted signals obtained by performing the above-described signal conversion are converted into digital input signals through the modulation circuit 420 (preferably, a modulation circuit using a delta-sigma modulator), and the resultant digital input signals are inputted into the switch-mode power amplifiers 100-1 and 100-2. This makes practicable the above-mentioned operation according to the present exemplary embodiment.

As described above, in the present exemplary embodiment, a switch-mode power amplifier into which pulses are inputted is selected from among the two switch-mode power amplifiers 100-1 and 100-2 depending on the output power of the Doherty amplifier (that is, the output power at the synthesis point X in FIG. 4), and the number of pulses to be inputted into the selected switch-mode power amplifier is controlled, and more specifically, the pulse decimation ratio is controlled.

Thus, it is possible to use the switch-mode power amplifier 100-1 as the first carrier switch-mode power amplifier or the peak switch-mode power amplifier, or to use the switch-mode power amplifier 100-2 as the second carrier switch-mode power amplifier, depending on the output power.

More specifically, the following operations can be performed. When the output power is low, only the switch-mode power amplifier 100-1 with a lower power-supply voltage $V_{d1}$ is made to operate as the first carrier switch-mode power amplifier. When the output power is larger than that at which the switch-mode power amplifier 100-1 has reached the saturation state, the operation of the switch-mode power amplifier 100-1 is put into an off state, and only the switch-mode power amplifier 100-2 with a higher power-supply voltage $V_{d2}$ is made to operate as the second carrier switch-mode power amplifier. When the output power is larger than that at which the switch-mode power amplifier 100-2 has reached the saturation state, the switch-mode power amplifier 100-2 is made to operate in the saturation state, and the operations of the switch-mode power amplifier 100-1 is resumed and made to operate as the peak switch-mode power amplifier.

In this way, it is possible to form two back-off efficiency peak points by the two switch-mode power amplifiers 100-1 and 100-2; therefore, the effect is achieved that it is possible to compose a Doherty amplifier of a few switch-mode power amplifiers and to avoid an increase in the number of amplifying elements.

In addition, since the switch-mode power amplifiers 100-1 and 100-2 are composed of Class-D amplifiers, the effect is achieved that it is possible to maintain high efficiency even during a low-power operation and to achieve highly efficient operations over a wider range of power levels. The effect is achieved of being insulated from the influence of variations in characteristics between amplifying elements. Additionally, the effect is achieved that it is possible to eliminate the need for or simplifying a matching circuit.

(2) A Second Exemplary Embodiment

Figure 9:
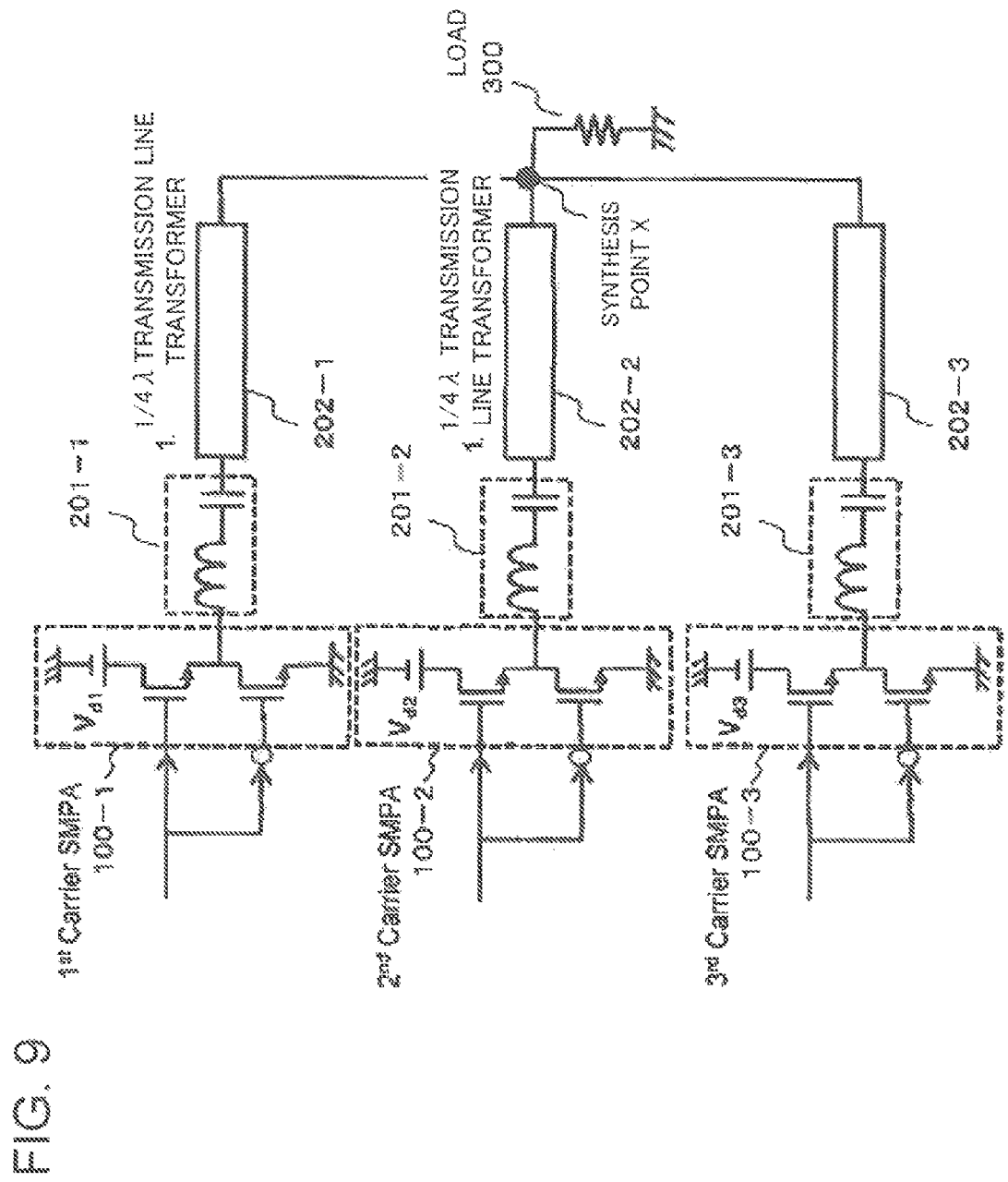
FIG. 9 is a diagram illustrating an example configuration of a Doherty amplifier in accordance with a second exemplary embodiment of the present invention.

FIG. 9 illustrates an example configuration of a Doherty amplifier in a transmitter in accordance with the present exemplary embodiment.

As illustrated in FIG. 9, the transmitter of the present exemplary embodiment additionally includes a switch-mode power amplifier 100-3, a filter 201-3, and a quarter-wave transmission line transformer 202-3, compared with the first exemplary embodiment illustrated in FIG. 4.

The transmitter in accordance with the present exemplary embodiment makes a synthesized signal at the synthesis point X from the outputs signals from three switch-mode power amplifiers whose power-supply voltages differ from each other (the switch-mode power amplifier 100-1 with a power-supply voltage $V_{d1}$, the switch-mode power amplifier 100-2 with a power-supply voltage $V_{d2}$, and the switch-mode power amplifier 100-3 with a power-supply voltage $V_{d3}$, where $V_{d1} < V_{d2} < V_{d3}$), and then supplies the synthesized signal to the load 300.

Although the signal synthesis circuit 200 illustrated in FIG. 2-1 is adopted in the configuration of FIG. 9, the other configurations described above (the configurations in FIGS. 2-2 to 2-4 or a configuration interchanging the inductor and the capacitor in FIG. 2-4) may also be used as the signal synthesis circuit 200.

The present exemplary embodiment is characterized by a method of inputting back-off codes into the switch-mode power amplifiers 100-1, 100-2, and 100-3, corresponding to a magnitude of the output power of the Doherty amplifier (that is, the output power at the synthesis point X in FIG. 9).

Since three switch-mode power amplifiers 100-1, 100-2, and 100-3 are included in the present exemplary embodiment contrary to the first exemplary embodiment, the number of practicable back-off efficiency peak points differs depending on the magnitude relationship between respective power-supply voltages.

In the present exemplary embodiment, it is assumed that the magnitude relationship between power-supply voltages $V_{d1}$, $V_{d2}$, and $V_{d3}$ corresponding to respective switch-mode power amplifiers 100-1, 100-2, and 100-3 satisfies the following condition:

$$V_{d1}, V_{d2} = \alpha V_{d1}, V_{d1} = \beta V_{d1} \qquad \text{[Formula 13]}$$

($\alpha$ AND $\beta$ ARE REAL NUMBERS SATISFYING $\beta = 1 + \alpha$, $\alpha > 1$)

Since the present exemplary embodiment has the above-described features, five back-off efficiency peak points can be formed by the three switch-mode power amplifiers 100-1, 100-2, and 100-3 under the aforementioned conditions as described below.

In contrast, the Doherty amplifier described in PTL 1 has required five peak amplifiers to form five back-off efficiency peak points; accordingly, at least six amplifiers including a carrier amplifier have been required.

According to the present exemplary embodiment, therefore, it is possible to form five back-off efficiency peak points by fewer switch-mode power amplifiers compared with the Doherty amplifier described in PTL 1.

A method of inputting back-off codes will be described below according to the present exemplary embodiment to form five back-off efficiency peak points by three switch-mode power amplifiers 100-1, 100-2, and 100-3.

Here, an output power region up to a first back-off efficiency peak point is referred to as a first operation region, an output power region up to a second back-off efficiency peak point is referred to as a second operation region, an output power region up to a third back-off efficiency peak point is referred to as a third operation region, an output power region up to a fourth back-off efficiency peak point is referred to as a fourth operation region, an output power region up to a fifth back-off efficiency peak point is referred to as a fifth operation region, and an out power region up to the final saturation efficiency peak point is referred to as a sixth operation region.

In the first operation region, a digital input signal whose pulse decimation ratio D satisfies the formula of 0 (saturation code)≤D<1 (off code) is inputted into the switch-mode power amplifier 100-1 only. Meanwhile, the switch-mode power amplifiers 100-2 and 100-3 are put into an off state by inputting an off code signal whose pulse decimation ratio D satisfies the formula of D=1, or alternatively by connecting it to ground using other control methods. That is to say, the switch-mode power amplifier 100-1 only is made to operate, and is used as a first carrier switch-mode power amplifier.

At this time, the impedance $R_{load1}$ viewing the load 300 side from the output end of the quarter-wave transmission line transformer 202-1 is equivalent to the impedance of the load 300, that is, the formula of $R_{load1}=R_L$ is satisfied. The impedance $Z_{load1}$ viewing the load 300 side from the output end of the switch-mode power amplifier 100-1 undergoes impedance conversion by the quarter-wave transmission line transformer 202-1 (its characteristic impedance represented by $Z_0$), resulting in the following.

$$Z_{load} = \frac{Z_0^2}{R_{load1}} = \frac{Z_0^2}{R_L} \qquad \text{[Formula 14]}$$

Thus, the maximum output power $P_{out1}$ is expressed as follows:

$$P_{out1} = \frac{V_{d1}^2}{2Z_{load1}} = \frac{R_L}{2}\left(\frac{V_{d1}}{Z_0}\right)^2 \qquad \text{[Formula 15]}$$

In the second operation region, a digital input signal whose pulse decimation ratio D satisfies the formula of 0 (saturation code)≤D<DC1 (where DC1 is set at a pulse decimation ratio by which output power greater than $P_{out1}$ is obtained) is inputted into the switch-mode power amplifier 100-2 only. Meanwhile, the switch-mode power amplifiers 100-1 and 100-3 are put into off states by inputting an off code signal whose pulse decimation ratio D satisfies the formula of D=1, or alternatively by connecting it to ground using other control methods. That is to say, the switch-mode power amplifier 100-2 only is made to operate, and is used as a second carrier switch-mode power amplifier.

At this time, the impedance $R_{load2}$ viewing the load 300 side from the output end of the quarter-wave transmission line transformer 202-2 is equivalent to the impedance of the load 300, that is, the formula of $R_{load2}=R_L$ is satisfied. The impedance $Z_{load2}$ viewing the load 300 side from the output end of the switch-mode power amplifier 100-2 undergoes impedance conversion by the quarter-wave transmission line transformer 202-2 (its characteristic impedance represented by $Z_0$), resulting in the following.

$$Z_{load2} = \frac{Z_0^2}{R_{load2}} = \frac{Z_0^2}{R_L} \qquad \text{[Formula 16]}$$

Thus, the maximum output power $P_{out2}$ is expressed as follows:

$$P_{out2} = \frac{V_{d2}^2}{2Z_{load2}} = \frac{R_L}{2}\left(\frac{V_{d2}}{Z_0}\right)^2 \qquad \text{[Formula 17]}$$
$$= \alpha^2 \frac{R_L}{2}\left(\frac{V_{d1}}{Z_0}\right)^2$$

In the third operation region, a digital input signal whose pulse decimation ratio D satisfies the formula of 0 (saturation code)≤D≤DC2 (where DC2 is set at a pulse decimation ratio by which output power greater than $P_{out2}$ is obtained) is inputted into the switch-mode power amplifier 100-3 only. Meanwhile, the switch-mode power amplifiers 100-1 and 100-2 are put into off states by inputting an off code signal whose pulse decimation ratio D satisfies the formula of D=1, or alternatively by connecting it to ground using other control methods. That is to say, the switch-mode power amplifier 100-3 only is made to operate, and is used as a third carrier switch-mode power amplifier.

Alternatively, a digital input signal whose pulse decimation ratio D satisfies the formula of D=0 (saturation code) is inputted into the switch-mode power amplifier 100-2, and a digital input signal whose pulse decimation ratio D satisfies the formula of 0 (saturation code)≤D<1 (off code) is inputted into the switch-mode power amplifier 100-1. Meanwhile, the switch-mode power amplifier 100-3 is put into an off state by inputting an off code signal whose pulse decimation ratio D satisfies the formula of D=1, or alternatively by connecting it to ground using other control methods. That is to say, the switch-mode power amplifier 100-2 is used as a second carrier switch-mode power amplifier, and the switch-mode power amplifier 100-1 is used as a peak switch-mode power amplifier. Even where using the control method, the power-supply voltage settings according to the present exemplary embodiment make it possible to obtain comparable efficiency characteristics.

At this time, the impedance $R_{load3}$ viewing the load 300 side from the output end of the quarter-wave transmission line transformer 202-3 is equivalent to the impedance of the load 300, that is, the formula of $R_{load3}=R_L$ is satisfied. The impedance $Z_{load3}$ viewing the load 300 side from the output end of the switch-mode power amplifier 100-3 undergoes impedance conversion by the quarter-wave transmission line transformer 202-3 (its characteristic impedance represented by $Z_0$), resulting in the following.

$$Z_{load3} = \frac{Z_0^2}{R_{load3}} = \frac{Z_0^2}{R_L} \qquad \text{[Formula 18]}$$

Thus, the maximum output power $P_{out3}$ is expressed as follows:

$$P_{out3} = \frac{V_{d3}^2}{2Z_{load3}} = \frac{R_L}{2}\left(\frac{V_{d3}}{Z_0}\right)^2 \qquad \text{[Formula 19]}$$
$$= (1+\alpha)^2 \frac{R_L}{2}\left(\frac{V_{d1}}{Z_0}\right)^2$$

In the fourth operation region, a digital input signal whose pulse decimation ratio D satisfies the formula of D=0 (saturation code) is inputted into the switch-mode power amplifier 100-3, and a digital input signal whose pulse decimation ratio D satisfies the formula of 0 (saturation code)≤D<1 (off code) is inputted into the switch-mode power amplifier 100-1. Meanwhile, the switch-mode power amplifier 100-2 is put into an off state by inputting an off code signal whose pulse decimation ratio D satisfies the formula of D=1, or alternatively by connecting it to ground using other control methods. That is to say, the switch-mode power amplifier 100-3 is used as a third carrier switch-mode power amplifier, and the switch-mode power amplifier 100-1 is used as a peak switch-mode power amplifier.

At this time, the impedance $R_{load1}$ and the impedance $R_{load3}$ viewing the load 300 side from the output ends of the quarter-wave transmission line transformers 202-1 and 202-3 are expressed respectively as follows:

$$R_{load1} = \frac{V_{out}}{i_1} = \frac{R_L(i_1 + i_{3MAX})}{i_1} \quad \text{[Formula 20]}$$

$$R_{load3} = \frac{V_{out}}{i_3} = \frac{R_L(i_1 + i_{3MAX})}{i_{3MAX}}$$

Thus, a load modulation arises where $R_{load1}$ and $R_{load3}$ fluctuate depending on the operating state of the switch-mode power amplifier 100-1 that serves as a peak switch-mode power amplifier.

Because of $i_{3max}=\beta \cdot i_{1max}$, $Z_{load1}$ and $Z_{load3}$ are expressed respectively when $i_1 \to i_{1max}$ as follows:

$$Z_{load1} = \frac{Z_0^2}{R_{load1}} = \frac{Z_0^2}{R_L(1 + i_{3max}/i_1)} \to \frac{Z_0^2}{(1+\beta)R_L} \quad \text{[Formula 21]}$$

$$Z_{load3} = \frac{Z_0^2}{R_{load3}} = \frac{Z_0^2}{R_L(1 + i_1/i_{3max})} \to \frac{Z_0^2}{(1+1/\beta)R_L}$$

Hence, the maximum output power $P_{out4}$ is expressed as follows:

$$P_{out4} = \frac{V_{d1}^2}{2Z_{load1}} + \frac{V_{d3}^2}{2Z_{load3}} \quad \text{[Formula 22]}$$

$$= \frac{V_{d1}^2}{2Z_0^2/(1+\beta)R_L} + \frac{V_{d3}^2}{2Z_0^2/(1+1/\beta)R_L}$$

$$= R_L\left(\frac{V_{d1}}{Z_0}\right)^2 \left\{\frac{1+\beta}{2} + \frac{\beta^2(1+1/\beta)}{2}\right\}$$

$$= R_L\left(\frac{V_{d1}}{Z_0}\right)^2 \frac{(1+\beta)^2}{2}$$

In the fifth operation region, a digital input signal whose pulse decimation ratio D satisfies the formula of D=0 (saturation code) is inputted into the switch-mode power amplifier 100-3, and a digital signal input whose pulse decimation ratio D satisfies the formula of 0 (saturation code)≤D<DC4 (where DC4 is set at a pulse decimation ratio by which output power greater than $P_{out4}$ is obtained) is inputted into the switch-mode power amplifier 100-2. Meanwhile, the switch-mode power amplifier 100-1 is put into an off state by inputting an off code signal whose pulse decimation ratio D satisfies the formula of D=1, or alternatively by connecting it to ground using other control methods. That is to say, the switch-mode power amplifier 100-3 is used as a third carrier switch-mode power amplifier, and the switch-mode power amplifier 100-2 is used as a peak switch-mode power amplifier.

At this time, the impedance $R_{load2}$ and the impedance $R_{load3}$ viewing the load 300 side from the output ends of the quarter-wave transmission line transformers 202-2 and 202-3 are expressed respectively as follows:

$$R_{load2} = \frac{V_{out}}{i_2} = \frac{R_L(i_2 + i_{3MAX})}{i_2} \quad \text{[Formula 23]}$$

$$R_{load3} = \frac{V_{out}}{i_3} = \frac{R_L(i_2 + i_{3MAX})}{i_{3MAX}}$$

Thus, a load modulation arises where $R_{load2}$ and $R_{load3}$ fluctuate depending on the operating state of the switch-mode power amplifier 100-2 that serves as a peak switch-mode power amplifier.

Because of $i_{2max}=\alpha \cdot i_{1max}$ and $i_{3max}=\beta \cdot i_{1max}$ ($\beta=1+\alpha$), $Z_{load2}$ and $Z_{load3}$ are expressed respectively when $i_1 \to i_{1max}$ as follows:

$$Z_{load2} = \frac{Z_0^2}{R_{load2}} = \frac{Z_0^2}{R_L(1 + i_{3max}/i_2)} \to \frac{Z_0^2}{(1+\beta/\alpha)R_L} \quad \text{[Formula 24]}$$

$$Z_{load3} = \frac{Z_0^2}{R_{load3}} = \frac{Z_0^2}{R_L(1 + i_2/i_{3max})} \to \frac{Z_0^2}{(1+\alpha/\beta)R_L}$$

Hence, the maximum output power $P_{out5}$ is expressed as follows:

$$P_{out5} = \frac{V_{d2}^2}{2Z_{load2}} + \frac{V_{d3}^2}{2Z_{load3}} \quad \text{[Formula 25]}$$

$$= \frac{V_{d2}^2}{2Z_0^2/(1+\beta/\alpha)R_L} + \frac{V_{d3}^2}{2Z_0^2/(1+\alpha/\beta)R_L}$$

$$= R_L\left(\frac{V_{d1}}{Z_0}\right)^2 \left\{\frac{\alpha^2(1+\beta/\alpha)}{2} + \frac{\beta^2(1+\alpha/\beta)}{2}\right\}$$

$$= R_L\left(\frac{V_{d1}}{Z_0}\right)^2 \frac{(\alpha+\beta)^2}{2}$$

In the sixth operation region, a digital input signal whose pulse decimation ratio D satisfies the formula of D=0 (saturation code) is inputted into the switch-mode power amplifiers 100-2 and 100-3, and a digital input signal whose pulse decimation ratio D satisfies the formula of 0 (saturation code)≤D<1 (off code) is inputted into the switch-mode power amplifier 100-1. That is to say, the switch-mode power amplifiers 100-2 and 100-3 are used as carrier switch-mode power amplifiers, and the switch-mode power amplifier 100-1 is used as a peak switch-mode power amplifier.

At this time, the impedances $R_{load1}$, $R_{load2}$, and $R_{load3}$ viewing the load 300 side from the output ends of the quarter-wave transmission line transformers 202-1, 202-2, and 202-3 are expressed respectively as follows:

$$R_{load1} = \frac{V_{out}}{i_1} = \frac{R_L(i_1 + i_{2MAX} + i_{3MAX})}{i_1} \quad \text{[Formula 26]}$$

$$R_{load2} = \frac{V_{out}}{i_2} = \frac{R_L(i_1 + i_{2MAX} + i_{3MAX})}{i_{2MAX}}$$

$$R_{load3} = \frac{V_{out}}{i_3} = \frac{R_L(i_1 + i_{2MAX} + i_{3MAX})}{i_{2MAX}}$$

Thus, a load modulation arises where $R_{load1}$, $R_{load2}$, and $R_{load3}$ fluctuate depending on the operating state of the switch-mode power amplifier 100-1 that serves as a peak switch-mode power amplifier.

Because of $i_{2max} = \alpha \cdot i_{1max}$ and $i_{3max} = \beta \cdot i_{1max}$ ($\beta = 1+\alpha$), $Z_{load1}$, $Z_{load2}$, and $Z_{load3}$ are expressed respectively when $i_1 \to i_{1max}$ as follows:

$$Z_{load1} = \frac{Z_0^2}{R_{load1}} \qquad \text{[Formula 27]}$$
$$= \frac{Z_0^2}{R_L\{1 + (i_{2max} + i_{3max})/i_1\}} \to \frac{Z_0^2}{2(1+\alpha)R_L}$$

$$Z_{load2} = \frac{Z_0^2}{R_{load2}}$$
$$= \frac{Z_0^2}{R_L\{1 + (i_1 + i_{3max})/i_{2max}\}} \to \frac{Z_0^2}{2(1+1/\alpha)R_L}$$

$$Z_{load3} = \frac{Z_0^2}{R_{load3}}$$
$$= \frac{Z_0^2}{R_L\{1 + (i_1 + i_{2max})/i_{3max}\}} \to \frac{Z_0^2}{2R_L}$$

Hence, the maximum output power $P_{out}$ is expressed as follows:

$$P_{out} = \frac{V_{d1}^2}{2Z_{load1}} + \frac{V_{d2}^2}{2Z_{load2}} + \frac{V_{d3}^2}{2Z_{load3}} \qquad \text{[Formula 28]}$$
$$= \frac{V_{d1}^2}{2Z_0^2/\{2(1+\alpha)R_L\}} + \frac{V_{d2}^2}{2Z_0^2/\{2(1+1/\alpha)R_L\}} + \frac{V_{d3}^2}{2Z_0^2/2R_L}$$
$$= R_L\left(\frac{V_{d1}}{Z_0}\right)^2\{(1+\alpha) + \alpha(1+\alpha) + (1+\alpha)^2\}$$
$$= R_L\left(\frac{V_{d1}}{Z_0}\right)^2 2(1+\alpha)^2 = R_L\left(\frac{V_{d1}}{Z_0}\right)^2 2\beta^2$$

Accordingly, $P_{out1}$, $P_{out2}$, $P_{out3}$, $P_{out4}$, and $P_{out5}$ are expressed respectively as follows:

$$P_{out1} = \frac{1}{\{2(1+\alpha)\}^2} P_{out}, \qquad \text{[Formula 29]}$$
$$P_{out2} = \frac{1}{1\{\alpha/(1+\alpha)\}^2} P_{out},$$
$$P_{out3} = \frac{1}{4} P_{out},$$
$$P_{out4} = \frac{1}{4\{(1+\beta)/\beta\}^2} P_{out},$$
$$P_{out5} = \frac{1}{4\{(\alpha+\beta)/\beta\}^2} P_{out}$$

Here, $\alpha=2$, $\beta=3$. In this case, the first back-off efficiency peak point is located at the back-off point that is expressed as follows:

$$-10\log\left[\frac{1}{\{2(1+\alpha)\}^2}\right] = 12.5 \text{ dB} \qquad \text{[Formula 30]}$$

The second back-off efficiency peak point is located at the back-off point that is expressed as follows:

$$-10\log\left[\frac{1}{4\{\alpha/(1+\alpha)\}^2}\right] = 9.5 \text{ dB} \qquad \text{[Formula 31]}$$

The third back-off efficiency peak point is located at the back-off point that is expressed as follows:

$$-10\log\left(\frac{1}{4}\right) = 6 \text{ dB} \qquad \text{[Formula 32]}$$

The fourth back-off efficiency peak point is located at the back-off point that is expressed as follows:

$$-10\log\left[\frac{1}{4\{(1+\beta)/\beta\}^2}\right] = 3.5 \text{ dB} \qquad \text{[Formula 33]}$$

The fifth back-off efficiency peak point is located at the back-off point that is expressed as follows:

$$-10\log\left[\frac{1}{4\{(\alpha+\beta)/\beta\}^2}\right] = 1.5 \text{ dB} \qquad \text{[Formula 34]}$$

Figure 10:
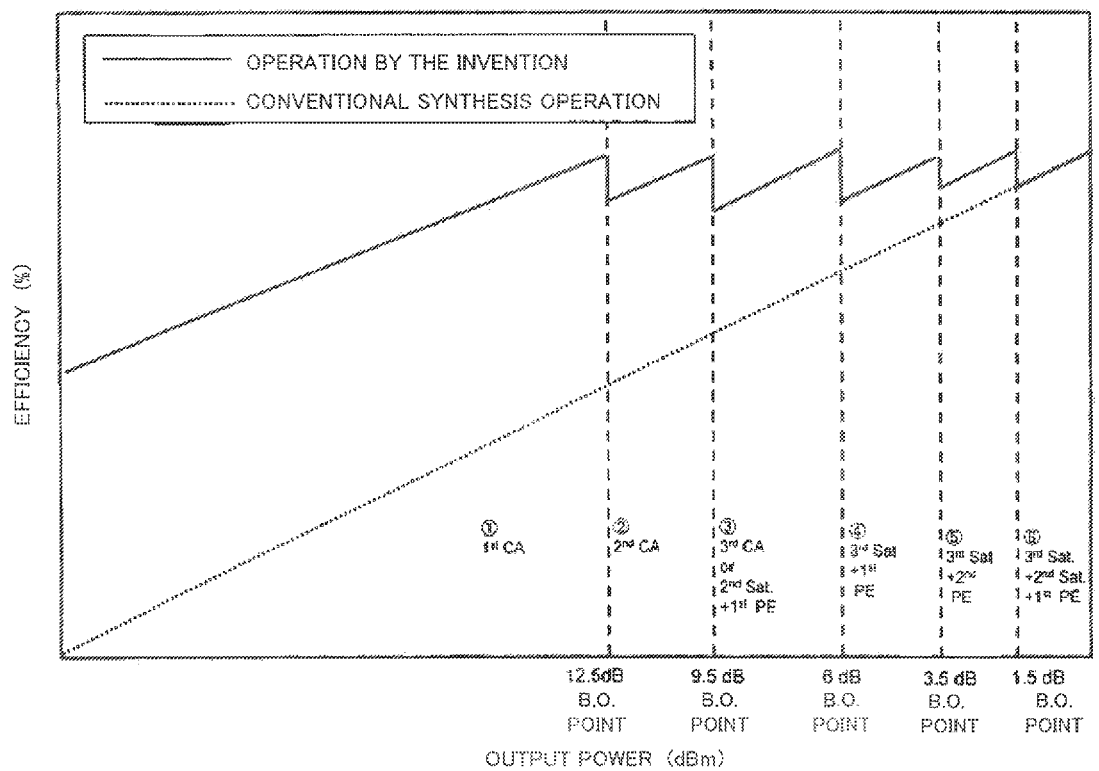
FIG. 10 is a diagram illustrating output and efficiency characteristics of the Doherty amplifier in accordance with the second exemplary embodiment of the present invention.

FIG. 10 illustrates output and efficiency characteristics expressing the efficiency against the output power of the Doherty amplifier (that is, the output power at the synthesis point X in FIG. 9) in the transmitter according to the present exemplary embodiment.

As illustrated in FIG. 10, the above-described method for inputting back-off codes enables the Doherty amplifier configured to include three switch-mode power amplifiers 100-1, 100-2, and 100-3 to have five back-off efficiency peaks.

The other effects provided by the present exemplary embodiment are the same as those by the first exemplary embodiment.

Because it is assumed in the present exemplary embodiment that a special case where $V_{d1}+V_{d2}=V_{d3}$ ($\beta=1+\alpha$) is satisfied, the same efficiency characteristics can be obtained in the third operation region by two ways of the control method. However, in general, if the condition of $V_{d1}V_{d2} \neq V_{d3}$ ($\beta \neq 1+\alpha$) is met, it is possible to give the characteristics up to six back-off efficiency peak points (up to 7 points if including a saturation efficiency peak point) by adding, to "$V_{d1}+V_{d2}$" and "$V_{d3}$", a back-off efficiency peak point corresponding to each of them.

In general, if a synthesized signal is made at the synthesis point X by output signals from M channels (or M pieces) of switch-mode power amplifiers whose power-supply voltages differ from each other (that is, switch-mode power amplifiers with $V_{d1}$, $V_{d2}$, $V_{d3}$, . . . , $V_{dm}$, where $V_{d1} < V_{d2} < V_{d3} < \ldots < V_{dm}$), and then the synthesized signal is supplied to the load 300, it is possible to give the characteristics the following number of back-off efficiency peak points at a maximum (in a case where the sums of any combination of supply voltages differ from each other).

$$\sum_{a=1}^{M} \binom{M}{a} = (2^M - 1) \text{ POINTS} \quad \text{[Formula 35]}$$

where $$\binom{M}{a} \quad \text{[Formula 36]}$$

The formula 36 represents the number of ways for selecting a-pieces elements from M-pieces elements (that is, a combination: $_MC_a = M!/\{(M-a)!*a!\}$, where "!" represents a factorial).

The present invention has been described with reference to exemplary embodiments, but the invention is not limited to above-described embodiments. Various modifications that could be understood by those skilled in the art may be made to the configurations and details of the present invention within the scope of the invention. Modified examples of the present exemplary embodiment will be described below.

For example, it is assumed in the above exemplary embodiment that a Doherty amplifier is configured by combining a plurality of switch-mode power amplifiers whose power-supply voltages differ from each other with a plurality of voltage-to-current converting units whose voltage-to-current conversion ratios (impedances) are identical to each other. However, the present invention is not limited to this. That is to say, according to the present invention, a plurality of switch-mode power amplifiers whose power-supply voltages are identical to each other may be combined with a plurality of voltage-to-current converting units whose voltage-to-current conversion ratios (impedances) differ from each other. Alternatively, a plurality of switch-mode power amplifiers whose power-supply voltages differ from each other may be combined with a plurality of voltage-to-current converting units whose voltage-to-current conversion ratios (impedances) differ from each other. Alternatively, a plurality of switch-mode power amplifiers whose power-supply voltages are identical to each other may be combined with a plurality of voltage-to-current converting units whose voltage-to-current conversion ratios (impedances) are identical to each other.

It is assumed in the above exemplary embodiment that the digital transmission signal is composed of two bits or three bits, but the present invention is not limited to this and can deal with multi-bit digital transmission signals.

The example has been described in the above exemplary embodiment in which both the voltage-to-current converting unit and the band limiting unit are limited to a single band, but the present invention is not limited to this; the present invention can deal with an expansion to further multiple bands by increasing the number of elements composing the voltage-to-current converting unit and the band limiting unit. It could be understood that the signal synthesis circuit can be configured by the voltage-to-current converting unit in which a quarter-wave transmission line transformer is combined with a lumped parameter element.

In addition, the operations to make a synthesized signal from multi-bit digital signals and their effects have been described in the above exemplary embodiment on the assumption that quarter-wave transmission line transformers, lumped parameter elements, and switch-mode power amplifiers have ideal characteristics. However, depending on the elements actually used, it would be possible to compensate for parasitic components in the elements, modify line shapes or element values to bring the phases of the voltage waveform or the current waveform close to more ideal signal synthesis operations, or add an element for compensation.

This application is based upon and claims the benefit of priority from Japanese Patent Application No. 2014-43612, filed on Mar. 6, 2014, the disclosure of which is incorporated herein in its entirety by reference.

The invention claimed is:

1. A transmitter, comprising:
   a modulation circuit configured to modulate a baseband signal into a multi-bit digital signal including a component in a radio-frequency band;
   a plurality of switch-mode power amplifiers corresponding to each bit of the multi-bit digital signal output from the modulation circuit; and
   a signal synthesis circuit including a band limiting unit configured to perform a band limitation on output signals from the plurality of switch-mode power amplifiers, and a plurality of voltage-to-current converting units configured to perform a voltage-to-current conversion on respective output signals from the plurality of switch-mode power amplifiers, the signal synthesis circuit configured to makes a synthesized signal connecting the band limiting unit and the plurality of voltage-to-current converting units,
   wherein, depending on an output power at a synthesis point where the synthesized signal is made, a switch-mode power amplifier is selected which is configured to receive input of a pulse, and a pulse number of pulses to be inputted into the selected switch-mode power amplifier is controlled.

2. The transmitter according to claim 1, wherein a pulse decimation ratio is controlled when controlling the pulse number.

3. The transmitter according to claim 2, wherein the plurality of switch-mode power amplifiers include a Class-D amplifier.

4. The transmitter according to claim 2, wherein the plurality of voltage-to-current converting units differ from each other in impedance.

5. The transmitter according to claim 2, wherein the plurality of switch-mode power amplifiers differ from each other in power-supply voltage.

6. The transmitter according to claim 5,
   wherein the plurality of switch-mode power amplifiers includes a first switch-mode power amplifier and a second switch-mode power amplifier whose power-supply voltage is higher than a power-supply voltage of the first switch-mode power amplifier,
   wherein, if the output power is equal to or smaller than a first prescribed value, the first switch-mode power amplifier is selected, and the pulse decimation ratio of pulses to be inputted into the first switch-mode power amplifier is controlled depending on the output power,
   wherein, if the output power is greater than the first prescribed value and equal to or smaller than a second prescribed value that is greater than the first prescribed value, the second switch-mode power amplifier is selected, and the pulse decimation ratio of pulses to be inputted into the second switch-mode power amplifier is controlled depending on the output power,
   and wherein, if the output power is greater than the second prescribed value and equal to or smaller than a third prescribed value that is greater than the second prescribed value, the first switch-mode power amplifier and the second switch-mode power amplifier are selected, the pulse decimation ratio of pulses to be inputted into the second switch-mode power amplifier is controlled so as to become a fixed value, and the pulse decimation ratio of pulses to be inputted into the first switch-mode power amplifier is controlled depending on the output power.

7. The transmitter according to claim 5,
wherein the plurality of switch-mode power amplifiers includes a first switch-mode power amplifier, a second switch-mode power amplifier whose power-supply voltage is higher than a power-supply voltage of the first switch-mode power amplifier, and a third switch-mode power amplifier whose power-supply voltage is higher than a power-supply voltage of the second switch-mode power amplifier, wherein a sum of a power-supply voltage of the first switch-mode power amplifier and a power-supply voltage of the second switch-mode power amplifier is equal to a power-supply voltage of the third switch-mode power amplifier, wherein, if the output power is equal to or smaller than a first prescribed value, the first switch-mode power amplifier is selected, and the pulse decimation ratio of pulses to be inputted into the first switch-mode power amplifier is controlled depending on the output power, wherein, if the output power is greater than the first prescribed value and equal to or smaller than a second prescribed value that is greater than the first prescribed value, the second switch-mode power amplifier is selected, and the pulse decimation ratio of pulses to be inputted into the second switch-mode power amplifier is controlled depending on the output power, wherein, if the output power is greater than the second prescribed value and equal to or smaller than a third prescribed value that is greater than the second prescribed value, the third switch-mode power amplifier is selected, and the pulse decimation ratio of pulses to be inputted into the third switch-mode power amplifier is controlled depending on the output power, alternatively the first switch-mode power amplifier and the second switch-mode power amplifier are selected and the pulse decimation ratio of pulses to be inputted into the second switch-mode power amplifier is controlled so as to become a fixed value, and the pulse decimation ratio of pulses to be inputted into the first switch-mode power amplifier is controlled depending on the output power, wherein, if the output power is greater than the third prescribed value and equal to or smaller than a fourth prescribed value that is greater than the third prescribed value, the first switch-mode power amplifier and the third switch-mode power amplifier are selected, and the pulse decimation ratio of pulses to be inputted into the third switch-mode power amplifier is controlled so as to become a fixed value and the pulse decimation ratio of pulses to be inputted into the first switch-mode power amplifier is controlled depending on the output power, wherein, if the output power is greater than the fourth prescribed value and equal to or smaller than a fifth prescribed value that is greater than the fourth prescribed value, the second switch-mode power amplifier and the third switch-mode power amplifier are selected, and the pulse decimation ratio of pulses to be inputted into the third switch-mode power amplifier is controlled so as to become a fixed value and the pulse decimation ratio of pulses to be inputted into the second switch-mode power amplifier is controlled depending on the output power, and wherein, if the output power is greater than the fifth prescribed value and equal to or smaller than a sixth prescribed value that is greater than the fifth prescribed value, the first switch-mode power amplifier, the second switch-mode power amplifier, and the third switch-mode power amplifier are selected, and the pulse decimation ratio of pulses to be inputted into each of the second switch-mode power amplifier and the third switch-mode power amplifier is controlled so as to become a fixed value and the pulse decimation ratio of pulses to be inputted into the first switch-mode power amplifier is controlled depending on the output power.

8. The transmitter according to claim 2, wherein the modulation circuit uses a $\Delta\Sigma$ modulator and modulates the baseband signal into the multi-bit digital signal.

9. The transmitter according to claim 2,
wherein each of the plurality of voltage-to-current converting units is configured to have one of
a configuration including a quarter-wave transmission line transformer that is connected in series to a signal path between the switch-mode power amplifier and the synthesis point,
a configuration including an inductor and a capacitor, the inductor being connected in series to the signal path, and the capacitor being connected in parallel to the signal path in a stage following the inductor, and
a configuration including a capacitor and an inductor, the capacitor being connected in series to the signal path, and the inductor being connected in parallel to the signal path in a stage following the capacitor.

10. A transmission method, the transmission method performed by a transmitter including a plurality of switch-mode power amplifiers corresponding to each bit of a multi-bit digital signal, comprising:
making a synthesized signal connecting a band limiting unit configured to perform a band limitation on output signals from the plurality of switch-mode power amplifiers, and a plurality of voltage-to-current converting units configured to perform a voltage-to-current conversion on respective output signals from the plurality of switch-mode power amplifiers; and
selecting a switch-mode power amplifier configured to receive input of a pulse, and controlling a pulse number of pulses to be inputted into the selected switch-mode power amplifier, depending on an output power at a synthesis point where the synthesized signal is made.

11. The transmitter according to claim 3, wherein the plurality of voltage-to-current converting units differ from each other in impedance.

12. The transmitter according to claim 3, wherein the plurality of switch-mode power amplifiers differ from each other in power-supply voltage.

13. The transmitter according to claim 12,
wherein the plurality of switch-mode power amplifiers includes a first switch-mode power amplifier and a second switch-mode power amplifier whose power-supply voltage is higher than a power-supply voltage of the first switch-mode power amplifier,
wherein, if the output power is equal to or smaller than a first prescribed value, the first switch-mode power amplifier is selected, and the pulse decimation ratio of pulses to be inputted into the first switch-mode power amplifier is controlled depending on the output power,
wherein, if the output power is greater than the first prescribed value and equal to or smaller than a second prescribed value that is greater than the first prescribed value, the second switch-mode power amplifier is selected, and the pulse decimation ratio of pulses to be inputted into the second switch-mode power amplifier is controlled depending on the output power, and wherein, if the output power is greater than the second prescribed value and equal to or smaller than a third prescribed value that is greater than the second prescribed value, the first switch-mode power amplifier and the second switch-mode power amplifier are selected, the pulse decimation ratio of pulses to be inputted into the second switch-mode power amplifier is controlled so as to become a fixed value, and the pulse decimation ratio of pulses to be inputted into the first switch-mode power amplifier is controlled depending on the output power.

14. The transmitter according to claim 12, wherein the plurality of switch-mode power amplifiers includes a first switch-mode power amplifier, a second switch-mode power amplifier whose power-supply voltage is higher than a power-supply voltage of the first switch-mode power amplifier, and a third switch-mode power amplifier whose power-supply voltage is higher than a power-supply voltage of the second switch-mode power amplifier, wherein a sum of a power-supply voltage of the first switch-mode power amplifier and a power-supply voltage of the second switch-mode power amplifier is equal to a power-supply voltage of the third switch-mode power amplifier, wherein, if the output power is equal to or smaller than a first prescribed value, the first switch-mode power amplifier is selected, and the pulse decimation ratio of pulses to be inputted into the first switch-mode power amplifier is controlled depending on the output power, wherein, if the output power is greater than the first prescribed value and equal to or smaller than a second prescribed value that is greater than the first prescribed value, the second switch-mode power amplifier is selected, and the pulse decimation ratio of pulses to be inputted into the second switch-mode power amplifier is controlled depending on the output power, wherein, if the output power is greater than the second prescribed value and equal to or smaller than a third prescribed value that is greater than the second prescribed value, the third switch-mode power amplifier is selected, and the pulse decimation ratio of pulses to be inputted into the third switch-mode power amplifier is controlled depending on the output power, alternatively the first switch-mode power amplifier and the second switch-mode power amplifier are selected and the pulse decimation ratio of pulses to be inputted into the second switch-mode power amplifier is controlled so as to become a fixed value, and the pulse decimation ratio of pulses to be inputted into the first switch-mode power amplifier is controlled depending on the output power, wherein, if the output power is greater than the third prescribed value and equal to or smaller than a fourth prescribed value that is greater than the third prescribed value, the first switch-mode power amplifier and the third switch-mode power amplifier are selected, and the pulse decimation ratio of pulses to be inputted into the third switch-mode power amplifier is controlled so as to become a fixed value and the pulse decimation ratio of pulses to be inputted into the first switch-mode power amplifier is controlled depending on the output power, wherein, if the output power is greater than the fourth prescribed value and equal to or smaller than a fifth prescribed value that is greater than the fourth prescribed value, the second switch-mode power amplifier and the third switch-mode power amplifier are selected, and the pulse decimation ratio of pulses to be inputted into the third switch-mode power amplifier is controlled so as to become a fixed value and the pulse decimation ratio of pulses to be inputted into the second switch-mode power amplifier is controlled depending on the output power, and wherein, if the output power is greater than the fifth prescribed value and equal to or smaller than a sixth prescribed value that is greater than the fifth prescribed value, the first switch-mode power amplifier, the second switch-mode power amplifier, and the third switch-mode power amplifier are selected, and the pulse decimation ratio of pulses to be inputted into each of the second switch-mode power amplifier and the third switch-mode power amplifier is controlled so as to become a fixed value and the pulse decimation ratio of pulses to be inputted into the first switch-mode power amplifier is controlled depending on the output power.

15. The transmitter according to claim 3, wherein the modulation circuit uses a $\Delta\Sigma$ modulator and modulates the baseband signal into the multi-bit digital signal.

16. The transmitter according to claim 4, wherein the modulation circuit uses a $\Delta\Sigma$ modulator and modulates the baseband signal into the multi-bit digital signal.

17. The transmitter according to claim 5, wherein the modulation circuit uses a $\Delta\Sigma$ modulator and modulates the baseband signal into the multi-bit digital signal.

18. The transmitter according to claim 6, wherein the modulation circuit uses a $\Delta\Sigma$ modulator and modulates the baseband signal into the multi-bit digital signal.

19. The transmitter according to claim 7, wherein the modulation circuit uses a $\Delta\Sigma$ modulator and modulates the baseband signal into the multi-bit digital signal.

20. The transmitter according to claim 3, wherein each of the plurality of voltage-to-current converting units is configured to have one of a configuration including a quarter-wave transmission line transformer that is connected in series to a signal path between the switch-mode power amplifier and the synthesis point, a configuration including an inductor and a capacitor, the inductor being connected in series to the signal path, and the capacitor being connected in parallel to the signal path in a stage following the inductor, and a configuration including a capacitor and an inductor, the capacitor being connected in series to the signal path, and the inductor being connected in parallel to the signal path in a stage following the capacitor.

* * * * *